US008829600B2

(12) United States Patent
Hatori

(10) Patent No.: US 8,829,600 B2
(45) Date of Patent: Sep. 9, 2014

(54) POWER SEMICONDUCTOR DEVICE

(71) Applicant: Kenji Hatori, Tokyo (JP)

(72) Inventor: Kenji Hatori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/753,674

(22) Filed: Jan. 30, 2013

(65) Prior Publication Data

US 2013/0140603 A1   Jun. 6, 2013

Related U.S. Application Data

(62) Division of application No. 13/042,575, filed on Mar. 8, 2011, now Pat. No. 8,421,145.

(30) Foreign Application Priority Data

Jun. 23, 2010   (JP) ................................. 2010-142241

(51) Int. Cl.
*H01L 29/76* (2006.01)
*H01L 29/739* (2006.01)
*H01L 29/08* (2006.01)
*H01L 29/06* (2006.01)
*H01L 29/36* (2006.01)

(52) U.S. Cl.
CPC ........ *H01L 29/7395* (2013.01); *H01L 29/0834* (2013.01); *H01L 29/7397* (2013.01); *H01L 29/36* (2013.01); *H01L 29/0696* (2013.01)
USPC ........... 257/328; 257/341; 257/401; 257/592; 257/E29.118; 257/E29.257

(58) Field of Classification Search
USPC .................. 257/328, 341, 401, 592, E29.118, 257/E29.257
See application file for complete search history.

(56) References Cited

U.S. PATENT DOCUMENTS

| | | | |
|---|---|---|---|
| 5,162,876 | A | 11/1992 | Kitagawa et al. |
| 5,182,626 | A | 1/1993 | Akiyama et al. |
| 5,461,252 | A | 10/1995 | Nakura et al. |
| 5,629,551 | A | 5/1997 | Nakura et al. |
| 5,835,985 | A | 11/1998 | Hiyoshi et al. |
| 6,265,735 | B1 | 7/2001 | Takahashi et al. |
| 6,495,871 | B2 | 12/2002 | Hattori et al. |
| 2004/0232484 | A1 | 11/2004 | Zommer et al. |

(Continued)

FOREIGN PATENT DOCUMENTS

| | | |
|---|---|---|
| CN | 101587893 A | 11/2009 |
| DE | 10360574 A1 | 7/2005 |

(Continued)

OTHER PUBLICATIONS

Combined Chinese Office Action and Search Report issued on May 20, 2013, in patent Application No. 201110110576.X with English translation.

(Continued)

*Primary Examiner* — Andy Huynh
(74) *Attorney, Agent, or Firm* — Oblon, Spivak, McClelland, Maier & Neustadt, L.L.P.

(57) ABSTRACT

Provided is a power semiconductor device including a semiconductor substrate, in which a current flows in a thickness direction of the semiconductor substrate. The semiconductor substrate includes a resistance control structure configured so that a resistance to the current becomes higher in a central portion of the semiconductor substrate than a peripheral portion of the semiconductor substrate.

7 Claims, 18 Drawing Sheets

(56) References Cited

U.S. PATENT DOCUMENTS

| | | |
|---|---|---|
| 2005/0133857 A1 | 6/2005 | Mauder et al. |
| 2005/0263853 A1 | 12/2005 | Tomomatsu et al. |
| 2007/0120181 A1 | 5/2007 | Ruething et al. |
| 2009/0289277 A1 | 11/2009 | Yamaguchi |
| 2011/0121428 A1 | 5/2011 | Lin et al. |

FOREIGN PATENT DOCUMENTS

| | | |
|---|---|---|
| DE | 102005014714 A1 | 12/2005 |
| DE | 102005029263 A1 | 1/2007 |
| DE | 102005053487 A1 | 5/2007 |
| EP | 0485059 A2 | 9/1991 |
| JP | 6-342876 | 12/1994 |
| JP | 2005-50913 | 2/2005 |
| JP | 2010-4003 | 1/2010 |
| JP | 2010-62262 | 3/2010 |
| JP | 2010-135646 | 6/2010 |
| KR | 10-2010-0019345 | 2/2010 |

OTHER PUBLICATIONS

Office Action issued Aug. 27, 2012, in Korean Application No. 20-2011-0055422 (w/partial English translation).

German Office Action issued Jan. 8, 2013 with English translation for application No. 10 2011 077 841.1.

Japanese Office Action issued Feb. 19, 2013 with English translation for application No. 2010-142241.

Japanese Office Action issued on Oct. 4, 2012 in Japanese Application No. 2010-142241 (with English translation).

Office Action issued Dec. 5, 2013 in Chinese Patent Application No. 201110110576.X (with partial English language translation).

Office Action issued Feb. 18, 2014 in Japanese Patent Application No. 2012-267757 (with English translation).

F I G . 1 1
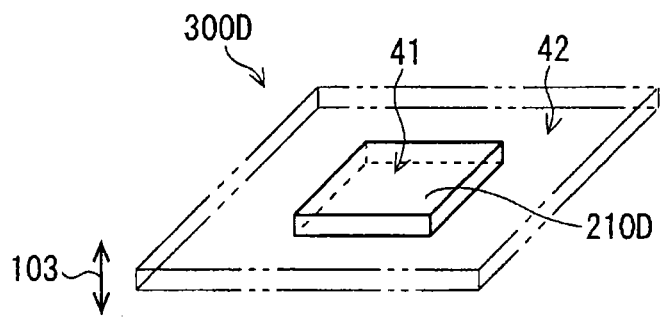
F I G . 1 2
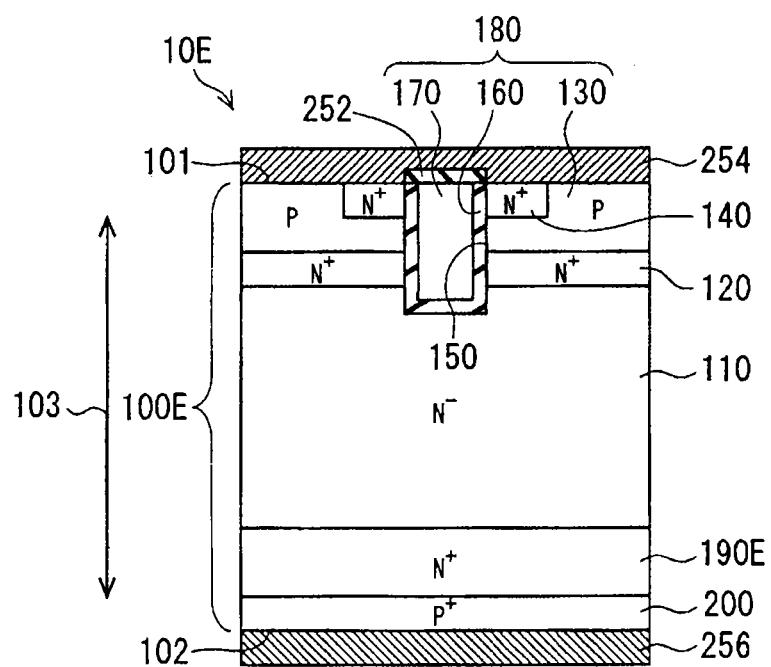

F I G . 1 8
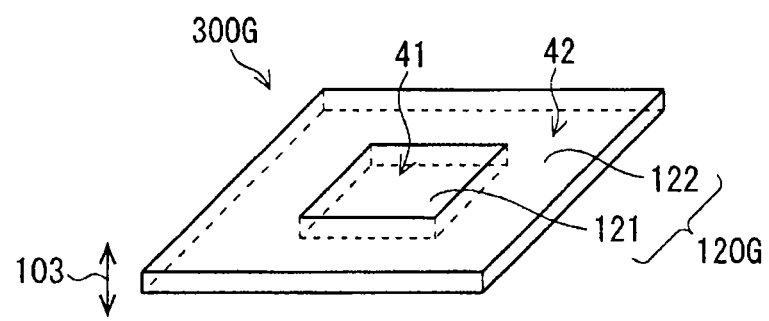
F I G . 1 9
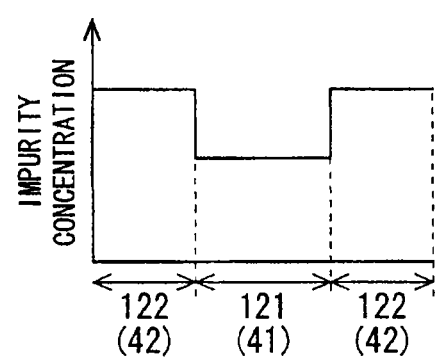

POWER SEMICONDUCTOR DEVICE

CROSS REFERENCE TO RELATED APPLICATION

This application is a Division of and claims the benefit of priority under 35 U.S.C. §120 from U.S. Ser. No. 13/042,575, filed Mar. 8, 2011, and claims the benefit of priority under 35 U.S.C. §119 from Japanese Patent Application No. 2010-142241, filed Jun. 23, 2010, the entire contents of each of which are incorporated herein by reference.

BACKGROUND OF THE INVENTION

1. Field of the Invention

The present invention relates to a power semiconductor device.

2. Description of the Background Art

Power semiconductor devices such as an insulated gate bipolar transistor (IGBT) handle a large amount of power, and as a result generate large amount of heat from conduction loss. Accordingly, the temperature of a semiconductor substrate increases greatly, and the temperature varies largely by an on/off operation.

Large temperature rise, temperature change or the like incurs, for example, fatigue of a wire-bonded portion, thus leading to a reduction in power cycle life. Note that the power cycle life is one indication of the reliability of a power semiconductor device, which indicates the life influenced by, for example, peeling of a wire bonding portion due to a temperature change incident to operation.

It is considered that, in a power semiconductor device, the temperature becomes higher in a central portion of the substrate than a peripheral portion of the substrate and the temperature of the entire substrate is increased by the temperature of the central portion of the substrate. Japanese Patent Application Laid-Open No. 06-342876 describes a semiconductor device having a function of detecting the temperature of the central portion of the substrate to prevent thermal fracture due to a temperature rise.

Specifically, in the semiconductor device of Japanese Patent Application Laid-Open No. 06-342876, the empty space is provided in the central portion of a power transistor (corresponding to the central portion of the substrate) formed on the semiconductor substrate, to thereby form a temperature detecting element such as a temperature detecting transistor in the empty space. The power transistor is controlled in accordance with the temperature detected by the temperature detecting element.

However, in the semiconductor device of Japanese Patent Application Laid-Open No. 06-342876, the region in which the temperature detecting element is disposed needs to be secured, which leads to an increase in device size.

SUMMARY OF THE INVENTION

An object of the present invention is to provide a power semiconductor device capable of preventing a temperature rise in a central portion of a substrate, which greatly affects the temperature of the entire substrate.

A power semiconductor device according to an aspect of the present invention includes a semiconductor substrate, in which a current flows in a thickness direction of the semiconductor substrate, the semiconductor substrate includes a resistance control structure configured so that a resistance to the current becomes higher in a central portion of the semiconductor substrate than a peripheral portion of the semiconductor substrate.

According to the aspect, the current flowing through the semiconductor substrate in a thickness direction becomes smaller in the central portion of the substrate compared with the peripheral portion of the substrate. Accordingly, heat generation due to the current is reduced in the central portion of the substrate, which prevents a temperature rise in the central portion of the substrate. The temperature of the central portion of the substrate greatly affects the temperature of the entire substrate, and thus a temperature rise of the entire substrate can be prevented. As a result, it is possible to improve the reliability of a power cycle life or the like. Further, according to the aspect, a temperature controlling effect can be achieved without using a temperature detecting element, and hence the device can be prevented from increasing in size due to adoption of the temperature detecting element.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a perspective view schematically showing a lifetime control layer according to the fourth preferred embodiment;

FIG. 12 is a vertical cross-sectional view schematically showing an IGBT according to a fifth preferred embodiment;

FIG. 18 is a perspective view schematically showing a carrier stored layer according to the seventh preferred embodiment;

FIG. 19 schematically shows an impurity concentration distribution of the carrier stored layer according to the seventh preferred embodiment;

DESCRIPTION OF THE PREFERRED EMBODIMENTS (First Preferred Embodiment)

Figure 1:
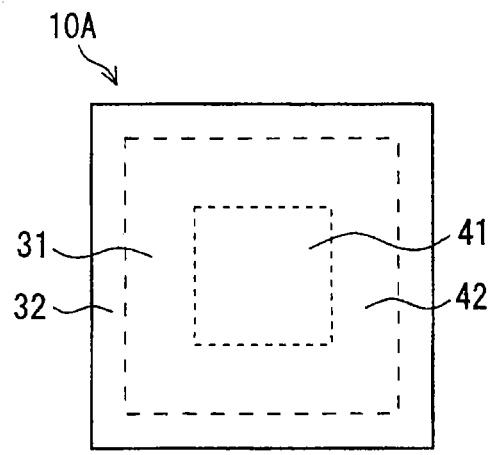
FIG. 1 is a plan view schematically showing an IGBT according to a first preferred embodiment.

In a first preferred embodiment, an IGBT is described as an example of a power semiconductor device. FIG. 1 is a plan view (in other words, top view) of a semiconductor chip of an IGBT 10A according to the first preferred embodiment. The IGBT 10A includes at least the semiconductor chip, and may include a bonding wire connected to the semiconductor chip and an insulating substrate on which the semiconductor chip is mounted, or the like. While the following description will be given of one semiconductor chip included in the IGBT 10A, the IGBT 10A may include a plurality of semiconductor chips.

In an example of FIG. 1, the semiconductor chip of the IGBT 10A can be roughly divided into an element portion 31 and a terminal portion 32. The element portion 31 is a region in which a plurality of power semiconductor elements (in this case, a plurality of IGBT unit elements) are disposed, for example, in matrix. The terminal portion 32 is a region in which a structure (for example, guard ring) for securing a breakdown voltage of the power semiconductor elements of the element portion 31 is formed. While it is also possible to adopt a structure that does not have the terminal portion 32, the terminal portion 32 is preferably provided in terms of improvements in breakdown voltage and the like.

The element portion 31 is a region including a center position of a chip (in other words, center position of a substrate) and extending, which does not reach an outer periphery of the chip (in other words, outer periphery of the substrate). The terminal portion 32 is a region from the outer periphery of the element portion 31 to the outer periphery of the chip, and has such a frame shape as to surround the element portion 31. In other words, the terminal portion 32 is a frame-shaped region that extends from the outer periphery of the chip to the center position of the chip, and the region inside the frame-shaped terminal portion 32 is the element portion 31.

Further, it is possible to roughly divide the semiconductor chip of the IGBT 10A into a central portion 41 and a peripheral portion 42. The central portion 41 is a region that includes the center position of the chip and extends but does not reach the outer periphery of the chip. The peripheral portion 42 is a region from the outer periphery of the central portion 41 to the outer periphery of the chip and has such a frame shape as to surround the central portion 41. In other words, the peripheral portion 42 is a frame-shaped region extending from the outer periphery of the chip toward the center position of the chip, and the region inside the frame-shaped peripheral portion 42 is the central portion 41.

Here, the central portion 41 is located as the region that does not extend beyond the element portion 31. For this reason, the central portion 41 and the peripheral portion 42 are partitioned in the element portion 31. In this case, the element portion 31 runs across the central portion 41 and the peripheral portion 42 and includes the entire central portion 41 and a part of the peripheral portion 42, which is continuous from the central portion 41. The peripheral portion 42 runs across the terminal portion 32 and the element portion 31 and includes the entire terminal portion 32 and a part of the element 31, which is continuous from the terminal portion 32.

The above-mentioned portions 31, 32, 41 and 42 are shown as two-dimensional regions in plan view of FIG. 1, which are also three-dimensional regions obtained by projecting the two-dimensional regions in a chip thickness direction (in other words, substrate thickness direction).

Figure 2:
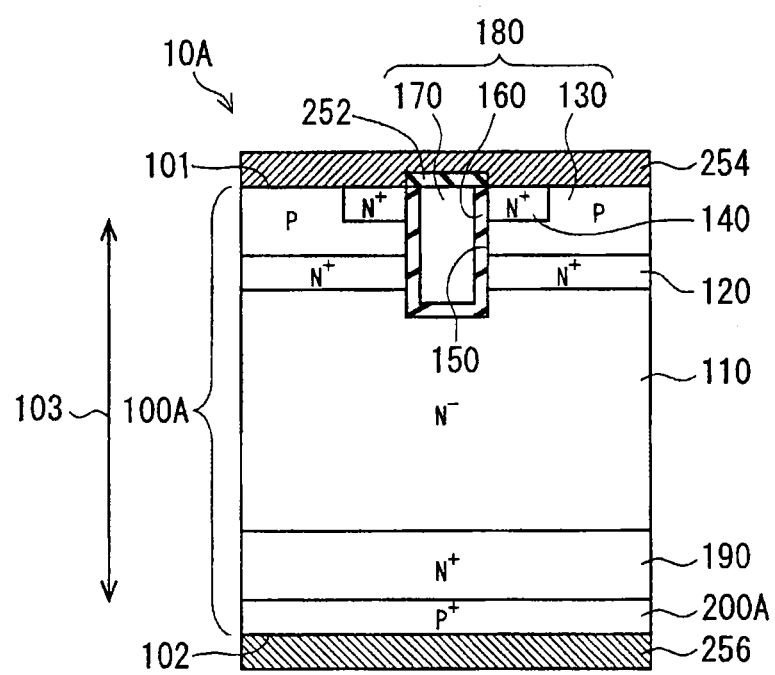
FIG. 2 is a vertical cross-sectional view schematically showing the IGBT according to the first preferred embodiment.

FIG. 2 is an illustrative vertical cross-sectional view of the semiconductor chip of the IGBT 10A. FIG. 2 illustrates the structure of one IGBT unit element.

According to the example of FIG. 2, the semiconductor chip includes a semiconductor substrate (hereinafter, also abbreviated as "substrate") 100A, and a drift layer 110 (corresponding to a "first semiconductor layer"), a carrier stored layer 120, a base layer 130, an emitter layer 140, a groove (in other words, trench) 150, a gate insulating film 160, a gate electrode 170, a buffer layer 190 and a collector layer 200A (corresponding to a "second semiconductor layer") are formed in the semiconductor substrate 100A.

The semiconductor substrate 100A is a substrate obtained by subjecting a semiconductor substrate (for example, a silicon substrate or a silicon carbide substrate) as a starting material to various treatments.

The drift layer 110 is positioned between a first main surface 101 and a second main surface 102 of the substrate 100A (which is apart from the first and second main surfaces 101 and 102) and extends with a thickness direction 103 of the substrate 100A as a thickness direction thereof. The case where the drift layer 110 extends over the entire substrate is described here as an example. In the above-mentioned example, the drift layer 110 extends over a plurality of IGBT unit elements provided in the element portion 31 and is shared by the unit elements. In addition, in the above-mentioned example, the drift layer 110 has such a form as to run across the central portion 41 and the peripheral portion 42.

The case where the conductivity type of the drift layer 110 is an N type, more specifically, the case where the drift layer 110 is an N type layer (N⁻ type layer) whose impurity concentration is set in a range typically referred to as low concentration is described here as an example. Further, the impurity concentration of the drift layer 110 is the same between the central portion 41 and the peripheral portion 42.

Note that the drift layer is also referred to as a "base layer" in some cases, and in those cases, the drift layer 110 is referred to as an "N base layer 110" and a base layer 130 described below is referred to as a "P base layer 130", to thereby distinguish the layers 110 and 130 from each other.

The carrier stored layer 120 is positioned between drift layer 110 and the first main surface 101 of the substrate 100A and extends with the substrate thickness direction 103 as the thickness direction thereof. In other words, the carrier stored layer 120 is positioned on the first main surface 101 side with respect to the drift layer 110 (with the drift layer 110 being a reference) in the substrate thickness direction 103 and faces the drift layer 110 in the thickness direction 103. The carrier stored layer 120 is continuous from the drift layer 110 but is apart from the first main surface 101. The case where the carrier stored layer 120 extends over the entire substrate is described here as an example. In the above-mentioned example, the carrier stored layer 120 extends over the plurality of IGBT unit elements provided in the element portion 31 and is shared by the unit elements. In addition, in the above-mentioned example, the carrier stored layer 120 has such a form as to run across the central portion 41 and the peripheral portion 42.

The case where the conductivity type of the carrier stored layer 120 is an N type, more specifically, the case where the carrier stored layer 120 is an N type layer ($N^+$ type layer) whose impurity concentration is higher than that of the drift layer 110 and is set in a range typically referred to as high concentration is described here as an example. Further, the impurity concentration of the carrier stored layer 120 is the same between the central portion 41 and the peripheral portion 42.

The base layer 130 is positioned between the carrier stored layer 120 and the first main surface 101 of the substrate 100A and extends with the substrate thickness direction 103 as the thickness direction thereof. In other words, the base layer 130 is positioned on the first main surface 101 side with respect to the drift layer 110 and the carrier stored layer 120 in the substrate thickness direction 103 and faces the drift layer 110 through the carrier stored layer 120 in the thickness direction 103. The base layer 130 is continuous from the carrier stored layer 120 and reaches the first main surface 101. Note that the emitter layer 140 described below is formed in part of the base layer 130. The case where the base layer 130 extends over the entire substrate is described here as an example. In the above-mentioned example, the base layer 130 extends over the plurality of IGBT unit elements provided in the element portion 31 and is shared by the unit elements. In addition, in the above-mentioned example, the base layer 130 has such a form as to run across the central portion 41 and the peripheral portion 42.

The case where the conductivity type of the base layer 130 is a P type, and the impurity concentration thereof is the same between the central portion 41 and the peripheral portion 42 is described here as an example.

Note that the base layer 130 is a semiconductor layer in which a channel is formed in a metal insulator semiconductor (MIS) structure described below, and thus the base layer 130 may be referred to as a "channel formation semiconductor layer 130".

The emitter layer 140 is provided as a well occupying a partial region of the base layer 130. The emitter layer 140 is formed to a predetermined depth from the first main surface 101 of the substrate 100A, which has a smaller depth compared with the base layer 130 and accordingly is apart from the carrier stored layer 120. In this case, the emitter layer 140 is positioned on the first main surface 101 side with respect to the drift layer 110, the carrier stored layer 120 and part of the base layer 130 in the substrate thickness direction 103 and faces the drift layer 110 through the carrier stored layer 120 and part of the base layer 130 in the thickness direction 103. The emitter layer 140 is individually provided in each IGBT unit element of the element portion 31 and is also provided in both of the central portion 41 and the peripheral portion 42.

The case where the conductivity type of the emitter layer 140 is N type, more specifically, the case where the emitter layer 140 has a higher impurity concentration compared with the drift layer 110 and is an $N^+$ type layer is described here as an example. Further, the impurity concentration is the same between the emitter layer 140 of the central portion 41 and the emitter layer 140 of the peripheral portion 42.

The groove 150 penetrates the emitter layer 140, the base layer 130 and the carrier stored layer 120 from the first main surface 101 of the substrate 100A toward the second main surface 102 side, which is formed to a predetermined depth within the drift layer 110. The groove 150 is individually provided in each IGBT unit element of the element portion 31 and is also provided in both of the central portion 41 and the peripheral portion 42.

The gate insulating film 160 is provided on an inner surface (more specifically, a side surface and a bottom surface) of the groove 150 but does not entirely fill the groove 150. It is possible to form the gate insulating film 160 from, for example, a silicon oxide or a silicon nitride. The gate electrode 170 is disposed on the gate insulating film 160 and fills the groove 150. In other words, the gate electrode 170 is buried in the groove 150 through the gate insulating film 160. It is possible to form the gate electrode 170 from, for example, a polysilicon or various metal materials. Note that the gate electrode 170 is drawn at a position (not shown) and is connected to a gate pad (not shown).

The buffer layer 190 is positioned between the drift layer 110 and the second main surface 102 of the substrate 100A and extends with the substrate thickness direction 103 as the thickness direction thereof. In other words, the buffer layer 190 is located on the second main surface 102 side with respect to the drift layer 110 in the substrate thickness direction 103 and faces the drift layer 110 in the thickness direction 103. The buffer layer 190 is continuous from the drift layer 110 but is apart from the second main surface 102. The case where the buffer layer 190 extends over the entire substrate is described here as an example. In the above-mentioned example, the buffer layer 190 extends over the plurality of IGBT unit elements provided in the element portion 31 and is shared by the unit elements. In addition, in the above-mentioned example, the buffer layer 190 has such a form as to run across the central portion 41 and the peripheral portion 42.

The case where the conductivity type of the buffer layer 190 is an N type, more specifically, the case where the buffer layer 190 has an impurity concentration higher than that of the drift layer 110 and is an $N^+$ type layer is described here as an example. In addition, the impurity concentration of the buffer layer 190 is the same between the central portion 41 and the peripheral portion 42.

The collector layer 200A is positioned between the buffer layer 190 and the second main surface 102 of the substrate 100A and extends with the substrate thickness direction 103 as the thickness direction thereof. In this case, the collector layer 200A is positioned on the second main surface 102 side with respect to the drift layer 110 and the buffer layer 190 in the substrate thickness direction 103 and faces the drift layer 110 through the buffer layer 190 in the thickness direction 103. The collector layer 200A is continuous from the buffer layer 190 and reaches the second main surface 102. The case where the collector layer 200A extends over the entire substrate is described here as an example. In the above-mentioned example, the collector layer 200A extends over the plurality of IGBT unit elements provided in the element portion 31 and is shared by the unit elements. In addition, in the above-mentioned example, the collector layer 200A has such a form as to run across the central portion 41 and the peripheral portion 42.

The case where the conductivity type of the collector layer 200A is a P type is described here as an example. The impurity concentration of the collector layer 200A will be described below.

Note that it is also possible to modify the semiconductor substrate 100A by adopting the conductivity types opposite to the above-mentioned conductivity types in the respective layers. Such modification can be adopted to various structures described below.

In the example of FIG. 2, the semiconductor chip of the IGBT 10A further includes an insulating layer 252, an emitter electrode 254 and a collector electrode 256.

The insulating layer 252 is disposed so as to close an opening of the groove 150 on the first main surface 101 of the substrate 100A and covers the gate electrode 170. While the insulating layer 252 does not extend over the emitter layer 140 in the example of FIG. 2, the insulating layer 252 may extend over the emitter layer 140.

The emitter electrode 254 extends over the first main surface 101 of the substrate 100A and is in contact with the base layer 130 and the emitter layer 140. The emitter electrode 254 also extends over the insulating layer 252. In this example, the emitter electrode 254 extends over the plurality of IGBT unit elements provided in the element portion 31 and is shared by the unit elements.

The collector electrode 256 extends over the second main surface 102 of the substrate 100A and is in contact with the collector layer 200A. In the above-mentioned example, the collector electrode 256 extends over the plurality of IGBT unit elements provided in the element portion 31 and is shared by the unit elements.

Next, the operation of the IGBT 10A will be outlined.

First, an on-state of the IGBT 10A will be described. The on-state is realized by applying a predetermined gate voltage ($V_{GE}$>0) between the emitter electrode 254 and the gate electrode 170 in the state in which a predetermined collector voltage ($V_{CE}$>0) is applied between the emitter electrode 254 and the collector electrode 256. Upon application of the voltage, an N type channel is formed in the base layer 130 in the vicinity of the gate electrode 170. The channel is formed between the emitter layer 140 and the carrier stored layer 120, whereby electrons are injected to the drift layer 110 from the emitter electrode 254 through the channel. The injected electrons provide a forward biased state between the drift layer 110 and the collector layer 200A, and the holes are injected from the collector layer 200A to the drift layer 110. As a result, the current (also referred to as collector current, on-current, main current or the like) of the IGBT 10A flows between the collector electrode 256 and the emitter electrode 254, that is, in the thickness direction 103 of the substrate 100A.

Next, an off-state of the IGBT will be described. The off-state is realized by satisfying the gate voltage $V_{GE} \leq 0$. Upon application of the voltage, the channel disappears, whereby the electrons are not injected from the emitter electrode 254 to the drift layer 110. Due to the electrons not being injected, the holes are not injected from the collector layer 200A. As a result, the current does not flow.

Here, a lamination structure of the gate electrode 170, the gate insulating film 160 and the base layer 130 (in the cross-sectional view of FIG. 2, it is considered that those are laminated in the direction orthogonal to the substrate thickness direction 103) forms a so-called MIS structure. Note that the MIS structure is particularly referred to as a metal oxide semiconductor (MOS) structure in a case where the gate insulating film 160 is an oxide film. As is apparent from the outline of the operation descried above, in the MIS structure, the current of the IGBT 10A is caused to flow by formation of the channel in the base layer 130, and the current is interrupted by disappearance of the channel. That is, a switching element 180 controlling on/off of the current of the IGBT 10A that has the MIS structure is formed.

As is understood from the configuration above, the switching element 180 is individually provided to each IGBT unit element. The gate electrodes 170 of the plurality of switching elements 180 are connected in common (in other words, in parallel) at a position (not shown), and hence the switching elements 180 operate in synchronization with each other.

While it is possible to adopt a structure that does not have the carrier stored layer 120, the carrier stored layer 120 is preferably provided for the following reason. That is, the carrier stored layer 120 has a higher impurity concentration compared with the drift layer 110 as described above, and thus a built-in potential of a junction between the carrier stored layer 120 and the base layer 130 becomes higher than a built-in potential of a junction between the drift layer 110 and the base layer 130 having the structure that does not have the carrier stored layer 120. Such a high built-in potential becomes a barrier to passing-through of the holes, which have been injected into the drift layer 110 from the collector layer 200A, to the emitter side. Accordingly, the holes are stored in the carrier stored layer 120. As a result, the carrier density on the emitter side increases, which reduces the resistance to on-state current (that is, on-resistance). In addition, the collector voltage $V_{CE}$ (that is, on-state voltage) when the on-state current flows is reduced.

Further, the buffer layer 190 is provided for preventing a punch through phenomenon in which a depletion layer reaches the collector layer 200A in the off-state, that is, the breakdown voltage holding state. FIG. 2 illustrates a punch through (PT) structure. Note that it is also possible to adopt a non-punch-through (NPT) structure in which the buffer layer 190 is not provided.

Figure 3:
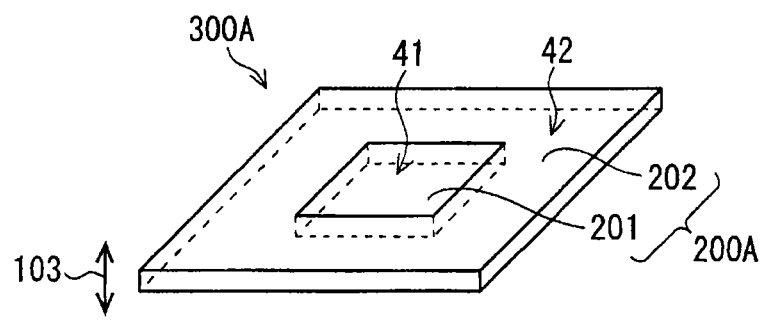
FIG. 3 is a perspective view schematically showing a collector layer according to the first preferred embodiment.

FIG. 3 is a perspective view schematically showing the collector layer 200A. FIG. 3 shows the collector layer 200A enlarged from the substrate 100A. Further, FIG. 4 schematically shows the impurity concentration distribution of the collector layer 200A in the vertical cross-section passing through the central portion 41.

Figure 4:
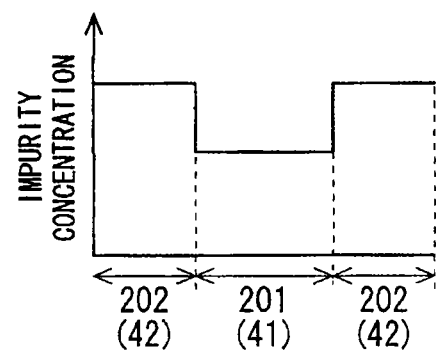
FIG. 4 schematically shows an impurity concentration distribution of the collector layer according to the first preferred embodiment.

As shown in FIG. 3 and FIG. 4, the collector layer 200A is roughly divided into a part 201 located in the central portion 41 and a part 202 located in the peripheral portion 42. In particular, the impurity concentration of the part 201 corresponding to the central portion 41 is set to be lower than the impurity concentration of the part 202 corresponding to the peripheral portion 42 (see FIG. 4). That is, the impurity concentration of the collector layer 200A is lower in the central portion 41 than the peripheral portion 42.

While FIG. 4 illustrates the distribution in which the impurity concentrations of the parts 201 and 202 steeply change, those may have a slope. Further, while the case where the low concentration part 201 and the high concentration part 202 are P type layers (P⁺ type layers) whose impurity concentration is set within a range typically referred to as high concentration, it is also possible to adopt, for example, such a concentration range that the low concentration part 201 is a P type and adopt such a concentration range that the high concentration part 202 is a P⁺ type.

The collector layer 200A having the above-mentioned impurity concentration distribution makes the injection efficiency of the holes injected to the drift layer 110 from the collector layer 200A lower in the central portion 41 than the peripheral portion 42. As a result, the resistance to the current flowing in the substrate thickness direction 103 becomes higher in the central portion 41 than the peripheral portion 42. That is, the collector layer 200A forms a resistance control structure 300A for making the resistance to the current flowing in the substrate thickness direction 103 higher in the central portion 41 than the peripheral portion 42.

The resistance control structure 300A reduces the current (more specifically, current density thereof) flowing through the substrate 100A in the thickness direction 103 in the central portion 41 than the peripheral portion 42. Therefore, heat generation due to the current is reduced in the central portion 41, and accordingly a temperature rise in the central portion 41 is reduced. The temperature of the central portion 41 greatly affects the temperature of the entire substrate, whereby it is possible to reduce a temperature rise of the entire substrate. As a result, it is possible to improve the reliability of a power cycle life or the like. Further, the resistance control structure 300A produces a temperature controlling effect without using a temperature detecting element, and thus an increase in device size that is caused by the adoption of a temperature detecting element can be avoided.

The IGBT 10A can be manufactured with the use of various known treatments. For example, it is possible to form the above-mentioned structure of the IGBT 10A by preparing an N⁻ type semiconductor substrate that ultimately provides the drift layer 110 as a starting material and then subjecting the substrate to treatments such as ion implantation, epitaxial film formation, masking, etching and oxidation.

For example, it is possible to form the collector layer 200A by combination of ion implantation performed on the central portion 41 and the peripheral portion 42 at the same time and ion implantation selectively performed only on the peripheral portion 42. Alternatively, the collector layer 200A may be formed by other techniques.

(Second Preferred Embodiment)

Figure 5:
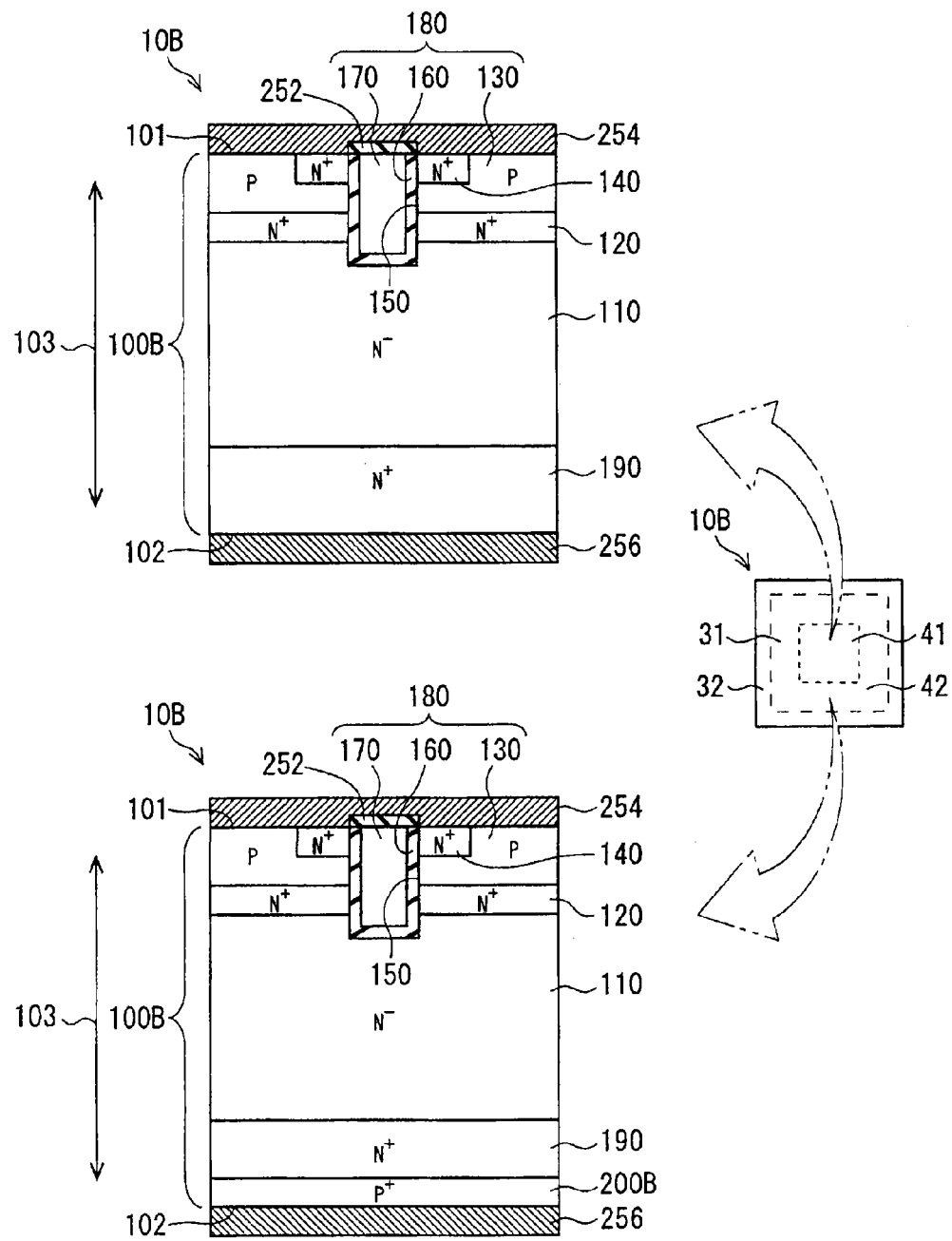
FIG. 5 schematically shows an IGBT according to a second preferred embodiment.

FIG. 5 schematically shows an IGBT 10B according to a second preferred embodiment. For simplification of the description, the right part of FIG. 5 shows a plan view corresponding to FIG. 1, the upper-left part thereof shows a vertical cross-sectional view of the central portion 41, and the lower-left part thereof shows a vertical cross-sectional view of the peripheral portion 42.

The IGBT 10B fundamentally has a similar configuration to that of the IGBT 10A (see FIG. 1 and FIG. 2) except for that the IGBT 10B includes a semiconductor substrate 100B in place of the semiconductor substrate 100A (see FIG. 2). The semiconductor substrate 100B fundamentally has a similar configuration to that of the semiconductor substrate 100A except for that the semiconductor substrate 100B includes a collector layer 200B in place of the collector layer 200A (see FIG. 2).

Figure 6:
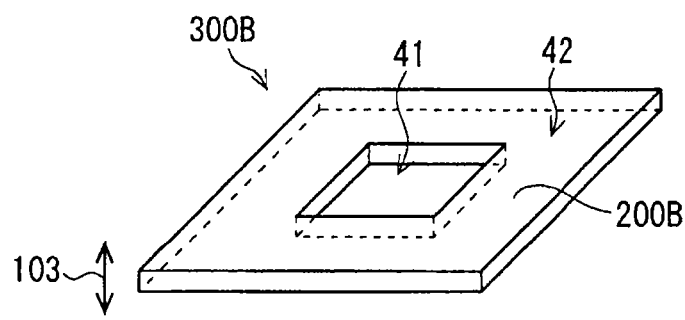
FIG. 6 is a perspective view schematically showing a collector layer according to the second preferred embodiment.

FIG. 6 is a perspective view schematically showing the collector layer 200B. FIG. 6 shows the collector layer 200B enlarged from the substrate 100B. As can be seen from FIG. 5 and FIG. 6, the collector layer 200B has such a form as to be located in the peripheral portion 42 but not located in the central portion 41. It is assumed here that the impurity concentration is uniform in the collector layer 200B. The other conditions of the collector layer 200B are fundamentally similar to those of the collector layer 200A (see FIG. 2).

Note that in the central portion 41 which does not have the collector layer 200B, the buffer layer 190 extends up to the second main surface 102 of the substrate 100B and reaches the collector electrode 256 (see the upper-left part of FIG. 5).

Owing to the collector layer 200B having the above-mentioned shape, the efficiency of injecting holes that are injected from the collector layer 200B to the drift layer 110 becomes lower in the central portion 41 compared with the peripheral portion 42. As a result, the resistance to the current flowing in the substrate thickness direction 103 becomes higher in the central portion 41 than the peripheral portion 42. That is, the collector layer 200B forms a resistance control structure 300B (see FIG. 6) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300B.

It is also possible to manufacture the IGBT 10B by various known treatments. For example, it is possible to form the collector layer 200B by selectively subjecting only the peripheral portion 42 to ion implantation. Alternatively, the collector layer 200B may be formed by other techniques.

(Third Preferred Embodiment)

Figure 7:
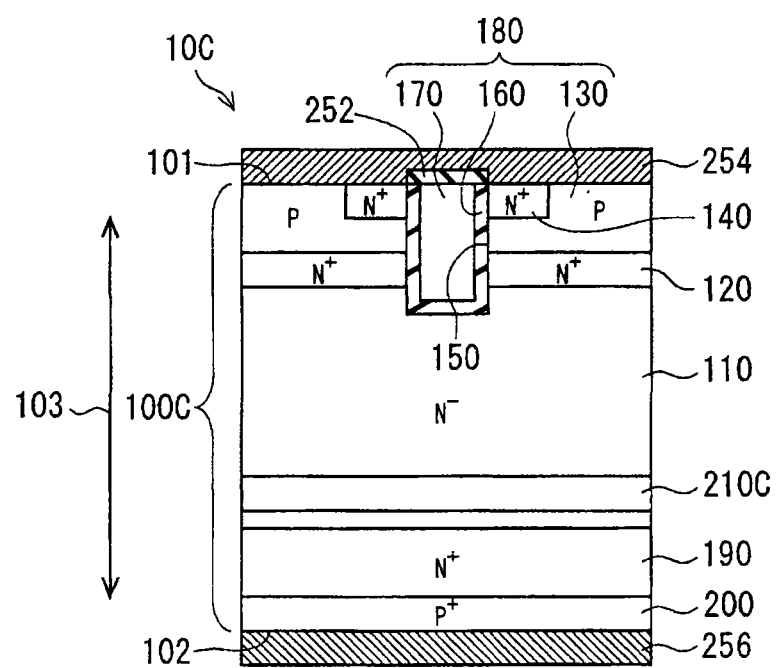
FIG. 7 is a vertical cross-sectional view schematically showing an IGBT according to a third preferred embodiment.

FIG. 7 is a vertical cross-sectional view schematically showing an IGBT 10C according to a third preferred embodiment. The IGBT 10C fundamentally has a similar configuration to that of the IGBT 10A (see FIG. 1 and FIG. 2) except for that the IGBT 10C includes a semiconductor substrate 100C in place of the semiconductor substrate 100A (see FIG. 2). The semiconductor substrate 100C fundamentally has a similar configuration to that of the semiconductor substrate 100A except for that the semiconductor substrate 100C includes a collector layer 200 in place of the collector layer 200A (see FIG. 2) and that a lifetime control layer 210C is added.

The collector layer 200 has the same impurity concentration between the central portion 41 and the peripheral portion 42, and other conditions are configured similarly to the collector layer 200A (see FIG. 2).

The lifetime control layer 210C is provided in the drift layer 110 and extends with the substrate thickness direction 103 as a thickness direction thereof. Accordingly, the lifetime control layer 210C is positioned on the first main surface 101 side with respect to the buffer layer 190 and the collector layer 200 in the substrate thickness direction 103 and faces the collector layer 200 through the buffer layer 190 in the thickness direction 103.

The lifetime control layer 210C is provided, in the drift layer 110, at a position far from the buffer layer 190 and the carrier stored layer 120 that are adjacent to the drift layer 110. In an example of FIG. 7, the lifetime control layer 210C is provided on the buffer layer 190 side in the drift layer 110. That is, the distance between the lifetime control layer 210C and the buffer layer 190 is smaller than the distance between the lifetime control layer 210 and the carrier stored layer 120.

The case where the lifetime control layer 210C extends over the entire substrate is described here as an example. In this example, the lifetime control layer 210C extends over the plurality of IGBT unit elements provided in the element portion 31 and is shared by the unit elements. Further, in this example, the lifetime control layer 210C has such a form as to be located to run across the central portion 41 and the peripheral portion 42.

Figure 8:
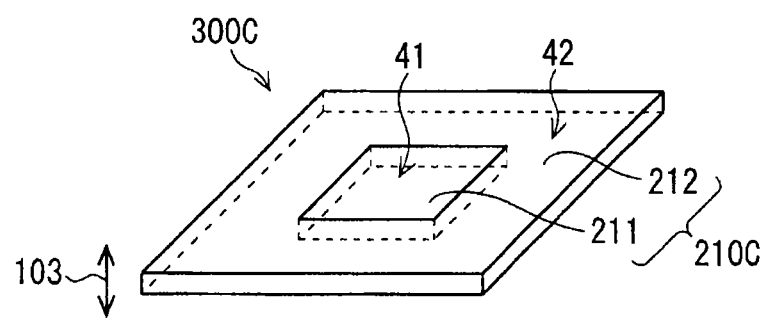
FIG. 8 is a perspective view schematically showing a lifetime control layer according to the third preferred embodiment.

FIG. 8 is a perspective view schematically showing the lifetime control layer 210C. FIG. 8 shows the lifetime control layer 210C enlarged from the substrate 100C. In addition, FIG. 9 schematically shows the lifetime killer concentration distribution of the lifetime control layer 210C in the cross-section passing through the central portion 41.

Figure 9:
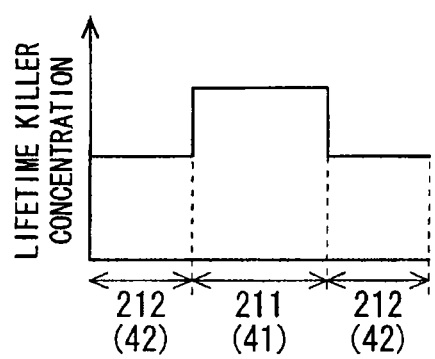
FIG. 9 schematically shows a lifetime killer concentration distribution of the lifetime control layer according to the third preferred embodiment.

As shown in FIG. 8 and FIG. 9, the lifetime control layer 210C is roughly divided into a part 211 located in the central portion 41 and a part 212 located in the peripheral portion 42. In particular, the lifetime killer concentration of the part 211 corresponding to the central portion 41 is set to be higher than the lifetime killer concentration of the part 212 corresponding to the peripheral portion 42 (see FIG. 9). That is, the lifetime killer concentration of the lifetime control layer 210C is higher in the central portion 41 than the peripheral portion 42.

While FIG. 9 illustrates the distribution in which the impurity concentrations in both parts 211 and 212 steeply change, the change thereof may have a slope.

The lifetime control layer 210C produces the effect of reducing typical switching loss as well as the following effect resulting from a difference in lifetime killer concentration.

That is, the lifetime control layer 210C having the above-mentioned lifetime killer concentration distribution makes the density of the holes injected from the collector layer 200 to the drift layer 110 smaller in the central portion 41 than the peripheral portion 42. Accordingly, the resistance to the current flowing in the substrate thickness direction 103 becomes higher in the central portion 41 than the peripheral portion 42. That is, the lifetime control layer 210C forms a resistance control structure 300C (see FIG. 8) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300C.

It is also possible to manufacture the IGBT 10C by various known techniques. For example, it is possible to form the lifetime control layer 210C by subjecting the drift layer 110 to proton irradiation, electron radiation or the like, to thereby introduce the lifetime killer into the drift layer 110. In this case, for example, it is possible to realize the above-mentioned lifetime killer concentration distribution (see FIG. 9) by combination of the irradiation performed on the central portion 41 and the peripheral portion 42 at the same time and the irradiation selectively performed only on the central portion 41. Alternatively, the lifetime control layer 210C may be formed by other techniques.

(Fourth Preferred Embodiment)

Figure 10:
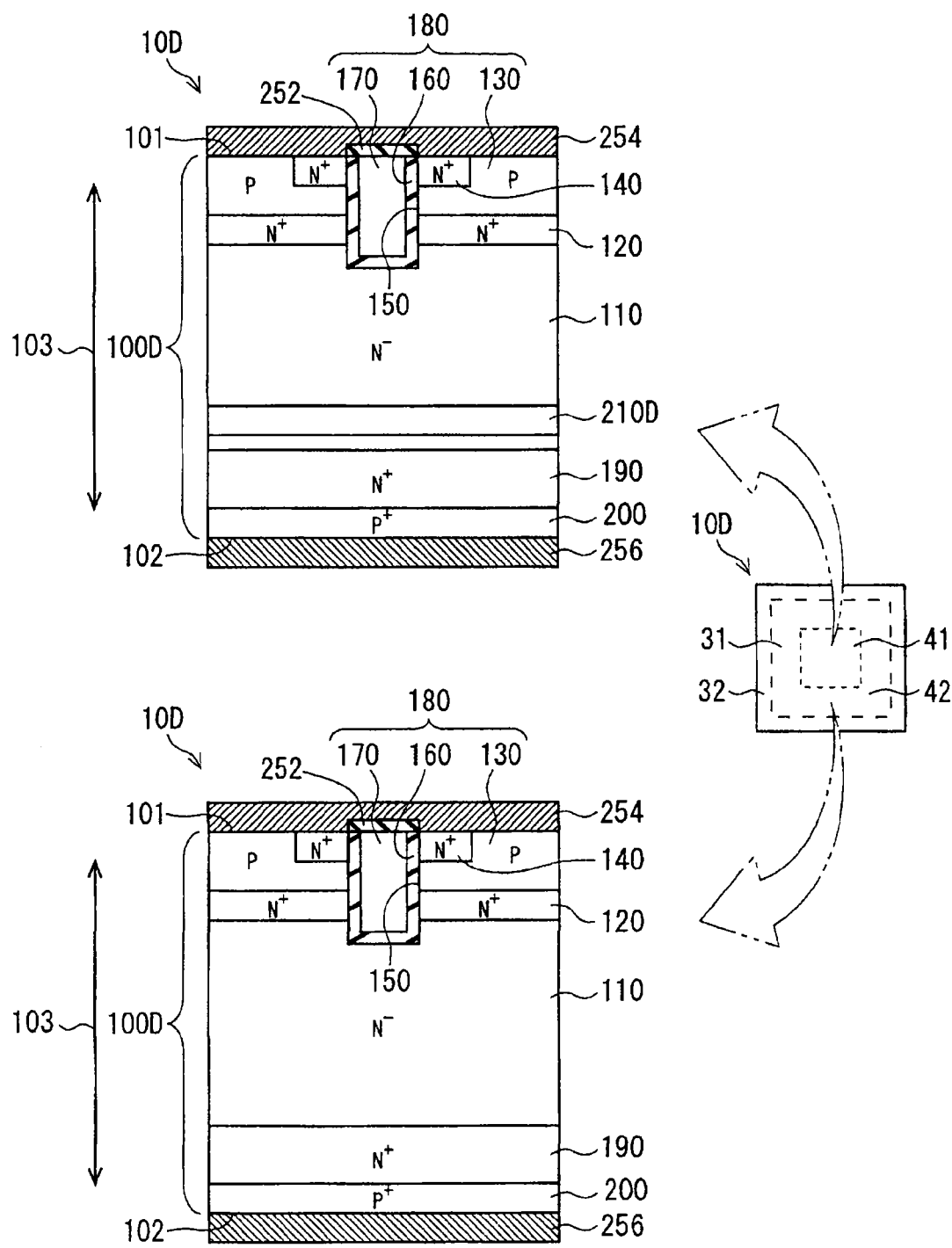
FIG. 10 schematically shows an IGBT according to a fourth preferred embodiment.

FIG. 10 schematically shows an IGBT 10D according to a fourth preferred embodiment, which is similar to FIG. 5.

The IGBT 10D fundamentally has a similar configuration to that of the IGBT 10C (see FIG. 7) except for that the IGBT 10D includes a semiconductor substrate 100D in place of the semiconductor substrate 100C (see FIG. 7). The semiconductor substrate 100D fundamentally has a similar configuration to that of the semiconductor substrate 100C except for that the semiconductor substrate 100D includes a lifetime control layer 210D in place of the lifetime control layer 210C (see FIG. 7).

FIG. 11 is a perspective view schematically showing the lifetime control layer 210D. FIG. 11 shows the lifetime control layer 210D enlarged from the substrate 100D. As can be seen from FIG. 10 and FIG. 11, the lifetime control layer 210D has such a form as to be located in the central portion 41 but not present in the peripheral portion 42. In FIG. 11, a chain double-dashed line indicates, in an auxiliary manner, the outline of the peripheral portion 42 in a depth range in which the lifetime control layer 210D is located. It is assumed here that the lifetime killer concentration is uniform in the lifetime control layer 210D. The other conditions of the lifetime control layer 210D are fundamentally similar to those of the lifetime control layer 210C (see FIG. 7).

Owing to the lifetime control layer 210D having the above-mentioned shape, the density of the holes injected into the drift layer 110 from the collector layer 200 becomes lower in the central portion 41 than the peripheral portion 42. As a result, the resistance to the current flowing in the substrate thickness direction 103 becomes higher in the central portion 41 than the peripheral portion 42. That is, the lifetime control layer 210D forms a resistance control structure 300D (see FIG. 11) for making the resistance to the current flowing in the substrate thickness direction 103 higher in the central portion 41 than the peripheral portion 42.

A similar effect to that of the resistance control structure 300A (see FIG. 3) can also be obtained also by the above-mentioned resistance control structure 300D.

It is also possible to manufacture the IGBT 10D by various known techniques. For example, it is possible to form the lifetime control layer 210D by selectively subjecting only the central portion 41 to proton irradiation or the like. The lifetime control layer 210D may be formed by other techniques.

(Fifth Preferred Embodiment)

FIG. 12 is a vertical cross-sectional view schematically showing an IGBT 10E according to a fifth preferred embodiment. The IGBT 10E fundamentally has a similar configuration to that of the IGBT 10A (see FIG. 1 and FIG. 2) except for that the IGBT 10E includes a semiconductor substrate 100E in place of the semiconductor substrate 100A (see FIG. 2). The semiconductor substrate 100E fundamentally has a similar configuration to that of the semiconductor substrate 100A except for that the semiconductor substrate 100E includes the collector layer 200 in place of the collector layer 200A (see FIG. 2) and a buffer layer 190E in place of the buffer layer 190 (see FIG. 2). The collector layer 200 has been described in the third preferred embodiment (see FIG. 7), and thus overlapping description is omitted here.

Figure 13:
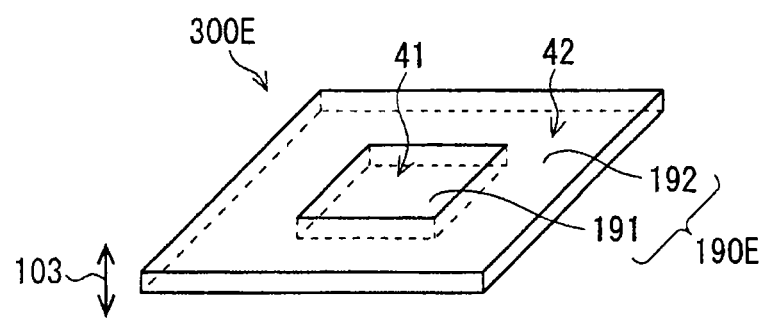
FIG. 13 is a perspective view schematically showing a buffer layer according to the fifth preferred embodiment.

FIG. 13 is a perspective view schematically showing the buffer layer 190E. FIG. 13 shows the buffer layer 190E enlarged from the substrate 100E. In addition, FIG. 14 schematically shows the impurity concentration distribution of the buffer layer 190E in the cross-section passing through the central portion 41.

Figure 14:
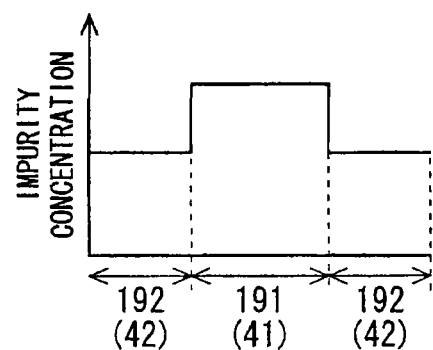
FIG. 14 schematically shows an impurity concentration distribution of the buffer layer according to the fifth preferred embodiment.

As shown in FIG. 13 and FIG. 14, the buffer layer 190E is roughly divided into a part 191 located in the central portion 41 and a part 192 located in the peripheral portion 42.

In particular, the impurity concentration of the part 191 corresponding to the central portion 41 is set to be higher than the impurity concentration of the part 192 corresponding to the peripheral portion 42 (see FIG. 14). That is, the impurity concentration of the buffer layer 190E is higher in the central portion 41 than the peripheral portion 42. The other conditions of the buffer layer 190E are fundamentally similar to those of the buffer layer 190 (see FIG. 2).

While FIG. 14 illustrates the distribution in which the impurity concentrations in both parts 191 and 192 change steeply, the change thereof may have a slope. In addition, the case where the high concentration part 191 and the low concentration part 192 are both $N^+$ type is described here as an example, it is possible to adopt such a concentration range that the low concentration part 192 has an N type and such a concentration range that the high concentration part 191 has an $N^+$ type.

Owing to the fact that the buffer layer 190E having the above-mentioned impurity concentration distribution is provided between the collector layer 200 and the drift layer 110, the efficiency of injecting the holes injected from the collector layer 200 to the drift layer 110 becomes lower in the central portion 41 than the peripheral portion 42. As a result, the resistance to the current flowing in the substrate thickness direction 103 becomes higher in the central portion 41 than the peripheral portion 42. That is, the buffer layer 190E forms a resistance control structure 300E (see FIG. 13) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300E.

It is also possible to manufacture the IGBT 10E by various known treatments. For example, it is possible to form the buffer layer 190E by combination of ion implantation performed on the central portion 41 and the peripheral portion 42 at the same time and ion implantation selectively performed only on the central portion 41. Alternatively, the buffer layer 190E may be formed by other techniques.

(Sixth Preferred Embodiment)

Figure 15:
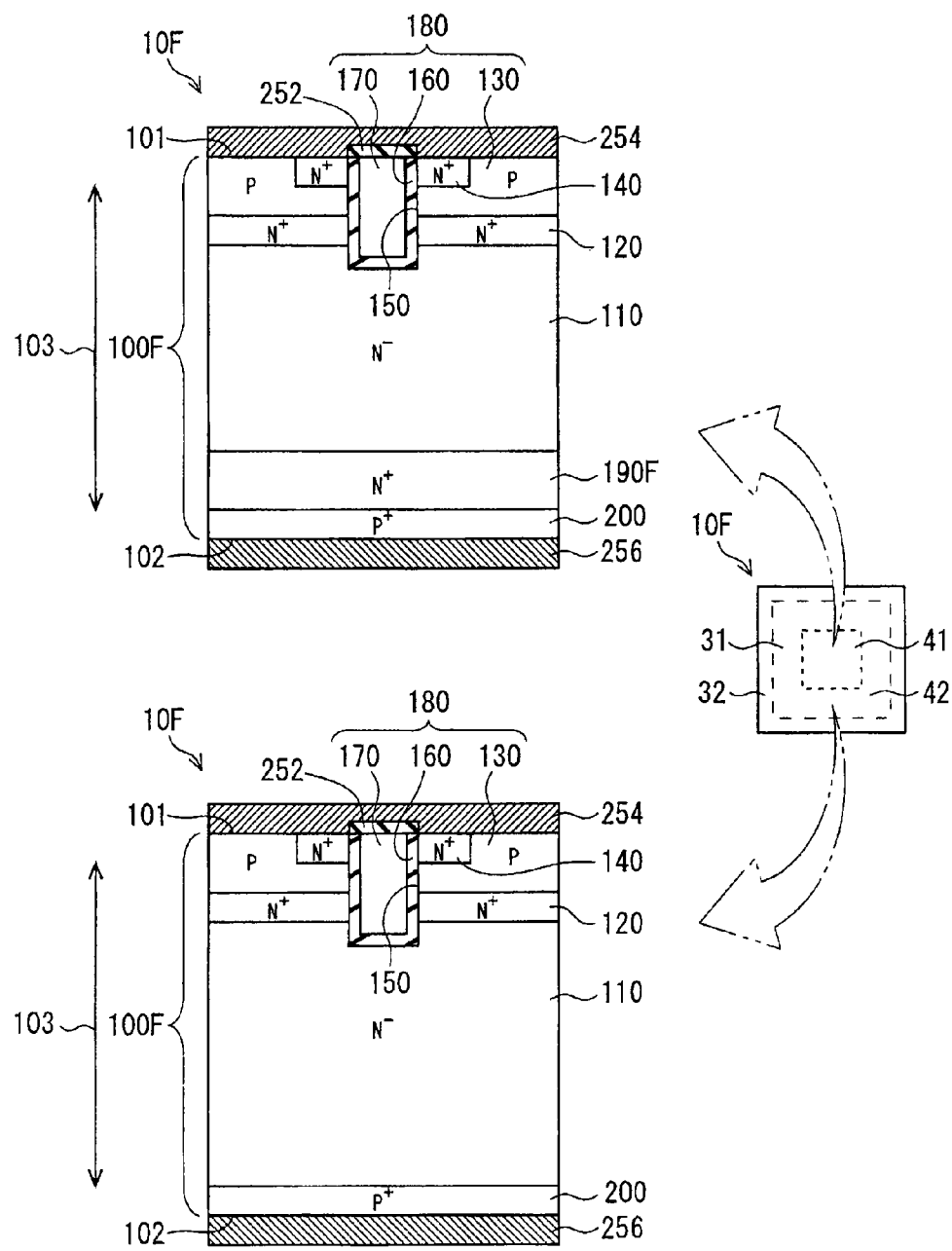
FIG. 15 schematically shows an IGBT according to a sixth preferred embodiment.

FIG. 15 schematically shows an IGBT 10F according to a sixth preferred embodiment, which is similar to FIG. 5.

The IGBT 10F fundamentally has a similar configuration to that of the IGBT 10E (see FIG. 12) except for that the IGBT 10F includes a semiconductor substrate 100F in place of the semiconductor substrate 100E (see FIG. 12). The semiconductor substrate 100F fundamentally has a similar configuration to that of the semiconductor substrate 100E except for that the semiconductor substrate 100F includes a buffer layer 190F in place of the buffer layer 190E (see FIG. 12).

Figure 16:
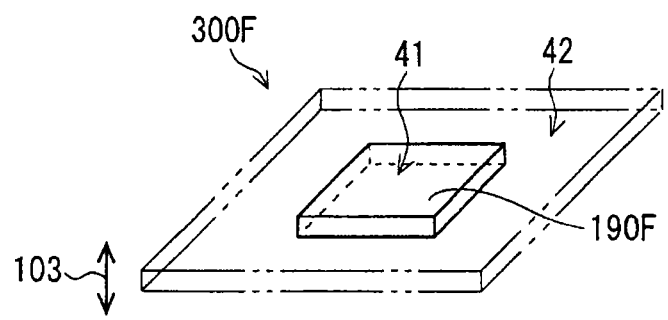
FIG. 16 is a perspective view schematically showing a buffer layer according to the sixth preferred embodiment.

FIG. 16 is a perspective view schematically showing the buffer layer 190F. FIG. 16 shows the buffer layer 190F enlarged from the substrate 100F. As can be seen from FIG. 15 and FIG. 16, the buffer layer 190F has such a form as to be located in the central portion 41 but not located in the peripheral portion 42. In FIG. 16, a chain double-dashed line indicates, in an auxiliary manner, the outline of the peripheral portion 42 in a depth range in which the buffer layer 190F is located. It is assumed here that the impurity concentration is uniform in the buffer layer 190F. The other conditions of the buffer layer 190F are fundamentally similar to those of the buffer layers 190 and 190E (see FIG. 2 and FIG. 12).

In the peripheral portion 42 that does not have the buffer layer 190F, the drift layer 110 extends up to the collector layer 200 (see lower-left part of FIG. 15).

Owing to the fact that the buffer layer 190F having the above-mentioned shape is provided between the collector layer 200 and the drift layer 110, the efficiency of injecting the holes injected from the collector layer 200 to the drift layer 110 becomes lower in the central portion 41 than the peripheral portion 42. As a result, the resistance to the current flowing in the substrate thickness direction 103 becomes higher in the central portion 41 than the peripheral portion 42. That is, the buffer layer 190F forms a resistance control structure 300F (see FIG. 16) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300F.

It is also possible to manufacture the IGBT 10F by various known treatments. For example, it is possible to form the buffer layer 190F by selectively subjecting only the central portion 41 to ion implantation. Alternatively, the buffer layer 190F may be formed by other techniques.

(Seventh Preferred Embodiment)

Figure 17:
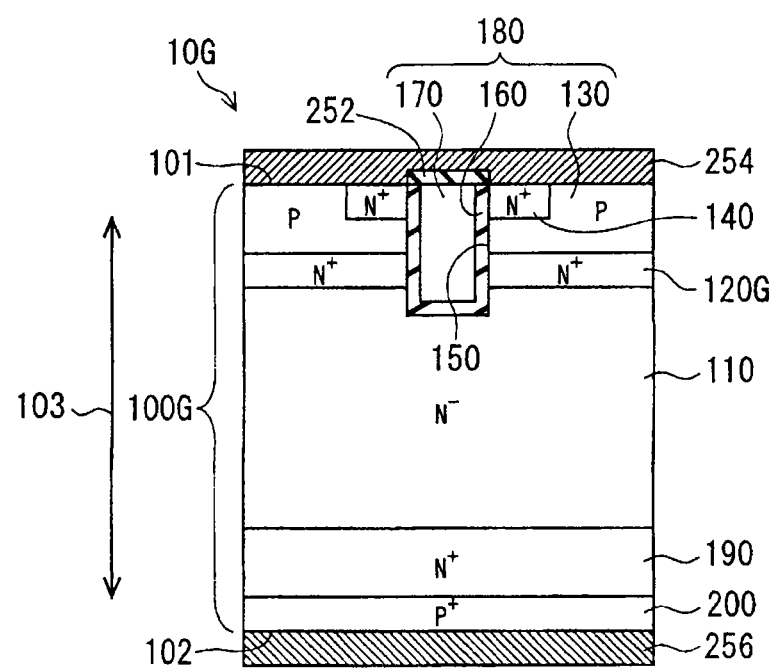
FIG. 17 is a vertical cross-sectional view schematically showing an IGBT according to a seventh preferred embodiment.

FIG. 17 is a vertical cross-sectional view schematically showing an IGBT 10G according to a seventh preferred embodiment. The IGBT 10G fundamentally has a similar configuration to that of the IGBT 10A (see FIG. 1 and FIG. 2) except for that the IGBT 10G includes a semiconductor substrate 100G in place of the semiconductor substrate 100A (see FIG. 2). The semiconductor substrate 100G fundamentally has a similar configuration to that of the semiconductor substrate 100A except for that the semiconductor substrate 100G includes the collector layer 200 in place of the collector layer 200A (see FIG. 2) and a carrier stored layer 120G in place of the carrier stored layer 120 (see FIG. 2). The collector layer 200 has been described in the third preferred embodiment (see FIG. 7), and thus overlapping description is omitted here.

FIG. 18 is a perspective view schematically showing the carrier stored layer 120G. FIG. 18 shows the carrier stored layer 120G enlarged from the substrate 100G. In addition, FIG. 19 schematically shows the impurity concentration distribution of the carrier stored layer 120G in the cross-section passing through the central portion 41.

As shown in FIG. 18 and FIG. 19, the carrier stored layer 120G is roughly divided into a part 121 located in the central portion 41 and a part 122 located in the peripheral portion 42. In particular, the impurity concentration of the part 121 corresponding to the central portion 41 is set to be lower than the impurity concentration of the part 122 corresponding to the peripheral portion 42 (see FIG. 19). That is, the impurity concentration of the carrier stored layer 120G is lower in the central portion 41 than the peripheral portion 42. The other conditions of the carrier stored layer 120G are fundamentally similar to those of the carrier stored layer 120 (see FIG. 2).

While FIG. 19 illustrates the distribution in which the impurity concentrations in both parts 121 and 122 change steeply, the change thereof may have a slope. In addition, the case where the low concentration part 121 and the high concentration part 122 are both $N^+$ type is described here as an example, it is possible to adopt such a concentration range that the low concentration part 121 has an N type and such a concentration range that the high concentration part 122 has an $N^+$ type.

Owing to the carrier stored layer 120G having the above-mentioned impurity concentration distribution, the carrier storing effect of storing the holes injected into the drift layer 110 from the collector layer 200 in the carrier stored layer 120G becomes smaller in the central portion 41 than the peripheral portion 42. The resistance to the current flowing in the substrate thickness direction 103 increases as the carrier storing effect becomes smaller, and hence the resistance becomes higher in the central portion 41 than the peripheral portion 42. That is, the carrier stored layer 120G forms a resistance control structure 300G (see FIG. 18) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300G.

It is also possible to manufacture the IGBT 10G by various known treatments. For example, it is possible to form the carrier stored layer 120G by combination of ion implantation performed on the central portion 41 and the peripheral portion 42 at the same time and ion implantation selectively performed only on the peripheral portion 42. Alternatively, the carrier stored layer 120G may be formed by other techniques.

(Eighth Preferred Embodiment)

Figure 20:
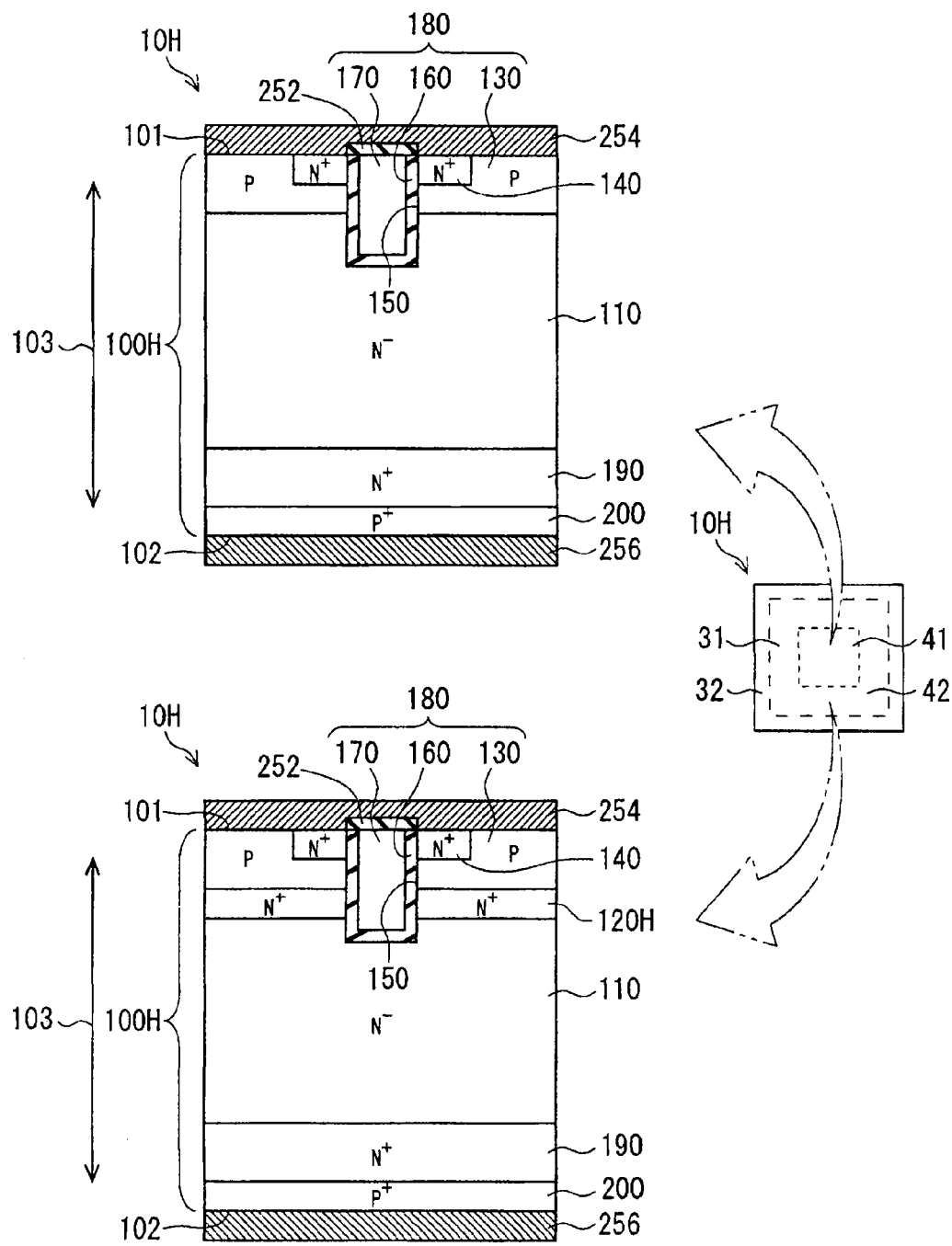
FIG. 20 schematically shows an IGBT according to an eighth preferred embodiment.

FIG. 20 schematically shows an IGBT 10H according to an eighth preferred embodiment, which is similar to FIG. 5.

The IGBT 10H fundamentally has a similar configuration to that of the IGBT 10G (see FIG. 17) except for that the IGBT 10H includes a semiconductor substrate 100H in place of the semiconductor substrate 100G (see FIG. 17). The semiconductor substrate 100H fundamentally has a similar configuration to that of the semiconductor substrate 100G except for that the semiconductor substrate 100H includes a carrier stored layer 120H in place of the carrier stored layer 120G (see FIG. 17).

Figure 21:
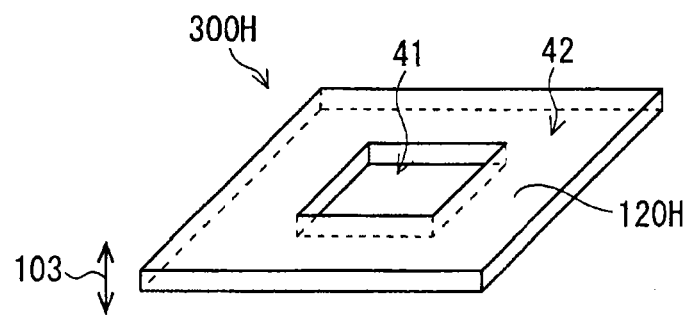
FIG. 21 is a perspective view schematically showing a carrier stored layer according to the eighth preferred embodiment.

FIG. 21 is a perspective view schematically showing the carrier stored layer 120H. FIG. 21 shows the carrier stored layer 120H enlarged from the substrate 100H. As can be seen from FIG. 20 and FIG. 21, the carrier stored layer 120H has such a form as to be located in the peripheral portion 42 but not located in the central portion 41. It is assumed here that the impurity concentration is uniform in the carrier stored layer 120H. The other conditions of the carrier stored layer 120H are fundamentally similar to those of the carrier stored layers 120 and 120G (see FIG. 2 and FIG. 17).

In the central portion 41 that does not have the carrier stored layer 120H, the drift layer 110 extends up to the base layer 130 (see upper-left part of FIG. 20).

Owing to the carrier stored layer 120H having the above-mentioned shape, the carrier storing effect of storing the holes injected into the drift layer 110 from the collector layer 200 in the carrier stored layer 120H becomes smaller in the central portion 41 than the peripheral portion 42. The resistance to the current flowing in the substrate thickness direction 103 increases as the carrier storing effect becomes smaller, and hence the resistance becomes higher in the central portion 41 than the peripheral portion 42. That is, the carrier stored layer 120H forms a resistance control structure 300H (see FIG. 21) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300H.

It is also possible to manufacture the IGBT 10H by various known treatments. For example, it is possible to form the carrier stored layer 120H by selectively subjecting only the peripheral portion 42 to ion implantation. Alternatively, the carrier stored layer 120H may be formed by other techniques.

(Ninth Preferred Embodiment)

Figure 22:
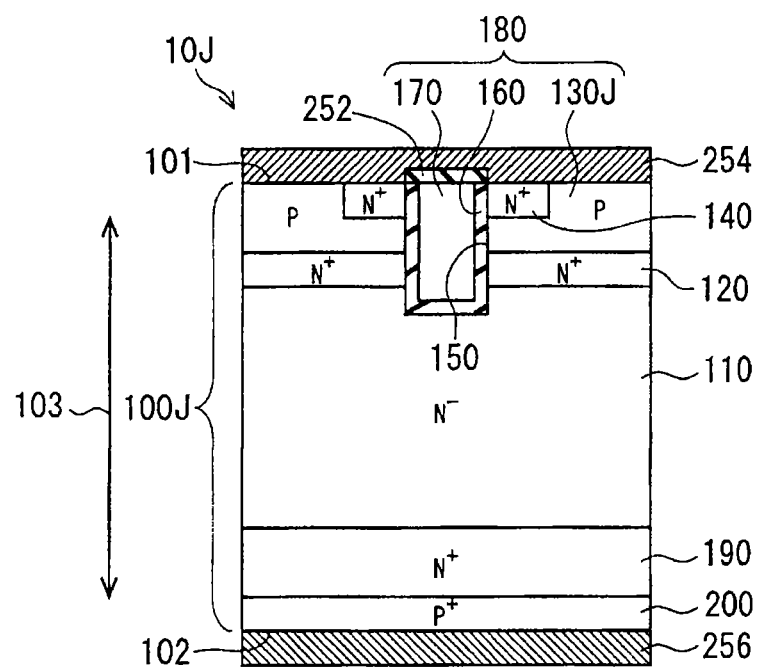
FIG. 22 is a vertical cross-sectional view schematically showing an IGBT according to a ninth preferred embodiment.

FIG. 22 is a vertical cross-sectional view schematically showing an IGBT 10J according to a ninth preferred embodiment. The IGBT 10J fundamentally has a similar configuration to that of the IGBT 10A (see FIG. 1 and FIG. 2) except for that the IGBT 10J includes a semiconductor substrate 100J in place of the semiconductor substrate 100A (see FIG. 2). The semiconductor substrate 100J fundamentally has a similar configuration to that of the semiconductor substrate 100A except for that the semiconductor substrate 100J includes the collector layer 200 in place of the collector layer 200A (see FIG. 2) and a base layer 130J in place of the base layer 130 (see FIG. 2). The collector layer 200 has been described in the third preferred embodiment (see FIG. 7), and thus overlapping description is omitted here.

Figure 23:
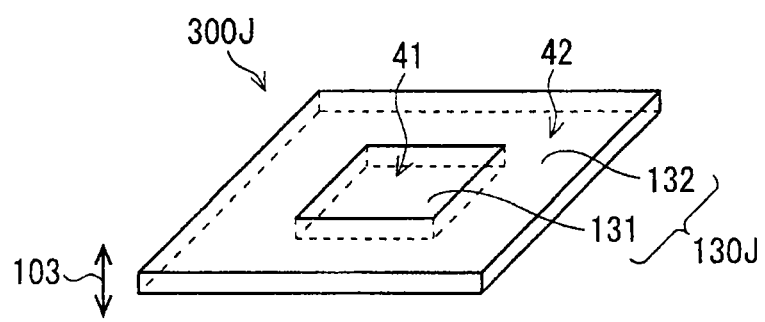
FIG. 23 is a perspective view schematically showing a base layer according to the ninth preferred embodiment.

FIG. 23 is a perspective view schematically showing the base layer 130J. FIG. 23 shows the base layer 130J enlarged from the substrate 100J. In addition, FIG. 24 schematically shows the impurity concentration distribution of the base layer 130J in the cross-section passing through the central portion 41.

Figure 24:
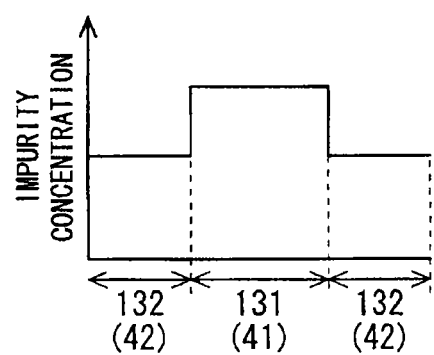
FIG. 24 schematically shows an impurity concentration distribution of the base layer according to the ninth preferred embodiment.

As shown in FIG. 23 and FIG. 24, the base layer 130J is roughly divided into a part 131 located in the central portion 41 and a part 132 located in the peripheral portion 42. In particular, the impurity concentration of the part 131 corresponding to the central portion 41 is set to be higher than the impurity concentration of the part 132 corresponding to the peripheral portion 42 (see FIG. 24). That is, the impurity concentration of the base layer 130J is higher in the central portion 41 than the peripheral portion 42. The other conditions of the base layer 130J are fundamentally similar to those of the base layer 130 (see FIG. 2).

While FIG. 24 illustrates the distribution in which the impurity concentrations in both parts 131 and 132 change steeply, the change thereof may have a slope. In addition, the case where the high concentration part 131 and the low concentration part 132 are both P type is shown here as an example, it is possible to adopt a concentration range of P⁻ type that is typically referred to as low concentration in the low concentration part 132 and adopt such a concentration range that the high concentration part 131 has a P type.

Owing to the base layer 130J (in other words, channel formation semiconductor layer 130J) having the above-mentioned impurity concentration distribution, a threshold voltage of the MIS switching element 180 becomes higher in the central portion 41 than the peripheral portion 42. In other words, the channel resistance of the MIS switching element 180 during application of the same voltage becomes higher in the central portion 41 than the peripheral portion 42. This results in a higher resistance to the current flowing in the substrate thickness direction 103 in the central portion 41 than the peripheral portion 42. That is, the base layer 130J forms a resistance control structure 300J (see FIG. 23) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300J.

It is also possible to manufacture the IGBT 10J by various known treatments. For example, it is possible to form the base layer 130J by combination of ion implantation performed on the central portion 41 and the peripheral portion 42 at the same time and ion implantation selectively performed only on the central portion 41. Alternatively, the base layer 130J may be formed by other techniques.

(Tenth Preferred Embodiment)

Figure 25:
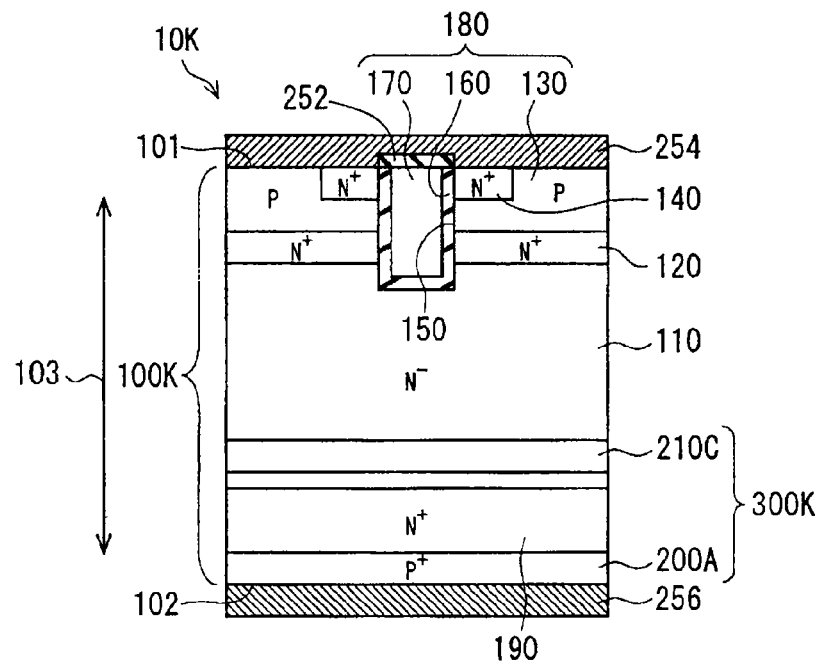
FIG. 25 is a vertical cross-sectional view schematically showing an IGBT according to a tenth preferred embodiment.

It is possible to combine various components constituting the above-mentioned resistance control structure 300A and the like in a variety of manners. For example, in the IGBT 10K illustrated in the vertical cross-sectional view of FIG. 25, a semiconductor substrate 100K includes the above-mentioned collector layer 200A and lifetime control layer 210C.

That is, a resistance control structure 300K of the IGBT 10K includes the collector layer 200A and the lifetime control layer 210C. A similar effect to that of the resistance control structure 300A (see FIG. 3) can be obtained also by the above-mentioned resistance control structure 300K. Alternatively, it is also possible to combine three or more of various components constituting the above-mentioned resistance control structure 300A and the like.

Note that in a case where the resistance control structure is formed by at least one of the collector layers 200A and 200B, lifetime control layers 210C and 210D, buffer layers 190E and 190F, the configurations of the switching element 180 side are equal to each other between the central portion 41 and the peripheral portion 42, whereby it is possible to prevent a current from locally concentrating in switching.

(Eleventh Preferred Embodiment)

The IGBT has been described above as an example of a power semiconductor device. In eleventh and twelfth preferred embodiments, a power MIS field effect transistor (FET) will be taken as other example of the power semiconductor device. Note that a MISFET is particularly referred to as a MOSFET in a case where a gate insulating film is an oxide film.

Figure 26:
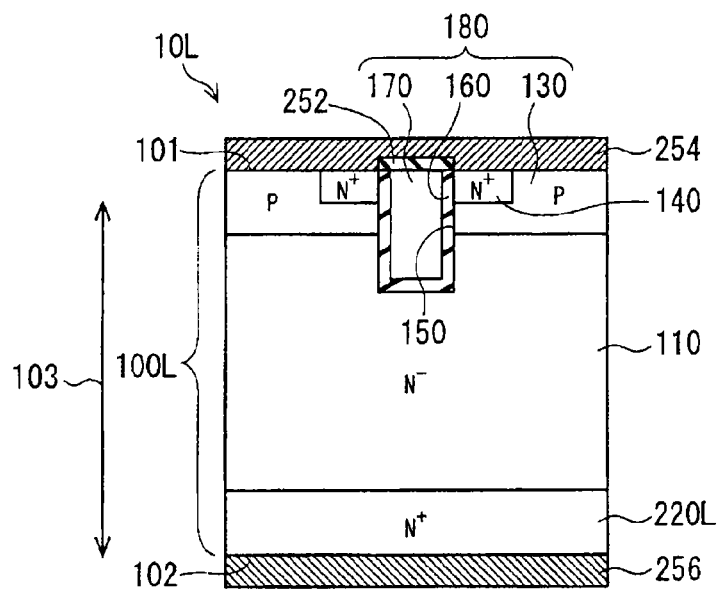
FIG. 26 is a vertical cross-sectional view schematically showing a power MISFET according to an eleventh preferred embodiment.

FIG. 26 is a vertical cross-sectional view schematically showing a power MISFET (hereinafter, also abbreviated as "MISFET") 10L according to the eleventh preferred embodiment. The MISFET 10L fundamentally has a similar configuration to that of the IGBT 10A (see FIG. 1 and FIG. 2) except for that the MISFET 10L includes a semiconductor substrate 100L in place of the semiconductor substrate 100A (see FIG. 2). The semiconductor substrate 100L fundamentally has a similar configuration to that of the semiconductor substrate 100A except for that the semiconductor substrate 100L does not include the collector layer 200A and the carrier stored layer 120 but includes a drain layer 220L (corresponding to the "third semiconductor layer") in place of the buffer layer 190.

Here, similarly to a general correspondence between components of the IGBT and components of the MISFET, the emitter layer 140, the emitter electrode 254 and the collector electrode 256 in the IGBT are referred to as a source layer 140, a source electrode 254 and a drain electrode 256 in the MISFET.

Note that the collector layer 200A (see FIG. 2) is not provided as described above, and thus the drain layer 220L extends from the drift layer 110 to the second main surface 102 of the substrate 100L to be in contact with the drain electrode 256. In addition, the carrier stored layer 120 (see FIG. 2) is not provided as described above, and thus the drift layer 110 and the base layer 130 are in contact with each other.

The drain layer 220L is positioned between the drift layer 110 and the second main surface 102 of the substrate 100L and extends with the substrate thickness direction 103 as the thickness direction thereof. In other words, the drain layer 220L is positioned on the second main surface 102 side with respect to the drift layer 110 in the substrate thickness direction 103 and faces the drift layer 110 in the thickness direction 103. The drain layer 220L is continuous from the drift layer 110 and reaches the second main surface 102. The case where the drain layer 220L extends over the entire substrate is described here as an example. In this example, the drain layer 220L extends over a plurality of MISFET unit elements provided in the element portion 31 and is shared by the unit elements. Further, in this example, the drain layer 220L has such a form as to run across the central portion 41 and the peripheral portion 42.

The case where the conductivity type of the drain layer 220L is an N type, more specifically, the case where the drain layer 220L has an impurity concentration higher than that of the drift layer 110 and is an N+ type layer is described here as an example.

Figure 27:
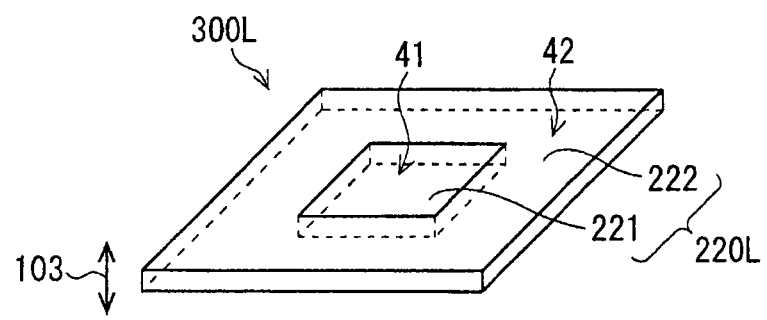
FIG. 27 is a perspective view schematically showing a drain layer according to the eleventh preferred embodiment.

FIG. 27 is a perspective view schematically showing the drain layer 220L. FIG. 27 shows the drain layer 220L enlarged from the substrate 100L. In addition, FIG. 28 schematically shows the impurity concentration distribution of the drain layer 220L in the vertical cross-section passing through the central portion 41.

Figure 28:
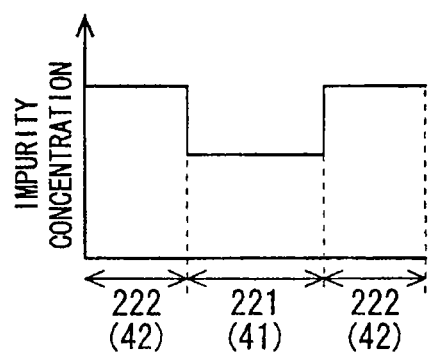
FIG. 28 schematically shows an impurity concentration distribution of the drain layer according to the eleventh preferred embodiment.

As shown in FIG. 27 and FIG. 28, the drain layer 220L is roughly divided into a part 221 located in the central portion 41 and a part 222 located in the peripheral portion 42. In particular, the impurity concentration of the part 221 corresponding to the central portion 41 is set to be lower than the impurity concentration of the part 222 corresponding to the peripheral portion 42 (see FIG. 28). That is, the impurity concentration of the drain layer 220L is lower in the central portion 41 than the peripheral portion 42.

While FIG. 28 illustrates the distribution in which the impurity concentrations in both parts 221 and 222 change steeply, the change thereof may have a slope. In addition, the case where the low concentration part 221 and the high concentration part 222 are both N+ type is shown here as an example, it is possible to adopt such a concentration range that the low concentration part 221 is an N type and such a concentration range that the high concentration part 222 has an N+ type.

In the drain layer 220L having the above-mentioned impurity concentration, the resistance to the current flowing in the substrate thickness direction 103 becomes higher in the central portion 41 than the peripheral portion 42. That is, the drain layer 220L forms a resistance control structure 300L (see FIG. 27) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300L.

It is also possible to manufacture the MISFET 10L by various known treatments. For example, it is possible to form the drain layer 220L by combination of ion implantation performed on the central portion 41 and the peripheral portion 42 at the same time and ion implantation selectively performed only on the peripheral portion 42. Alternatively, the drain layer 220L may be formed by other techniques.

Note that it is also possible to configure the resistance control structure by combination of the drain layer 220L and the above-mentioned base layer 130J (see FIG. 22).

(Twelfth Preferred Embodiment)

Figure 29:
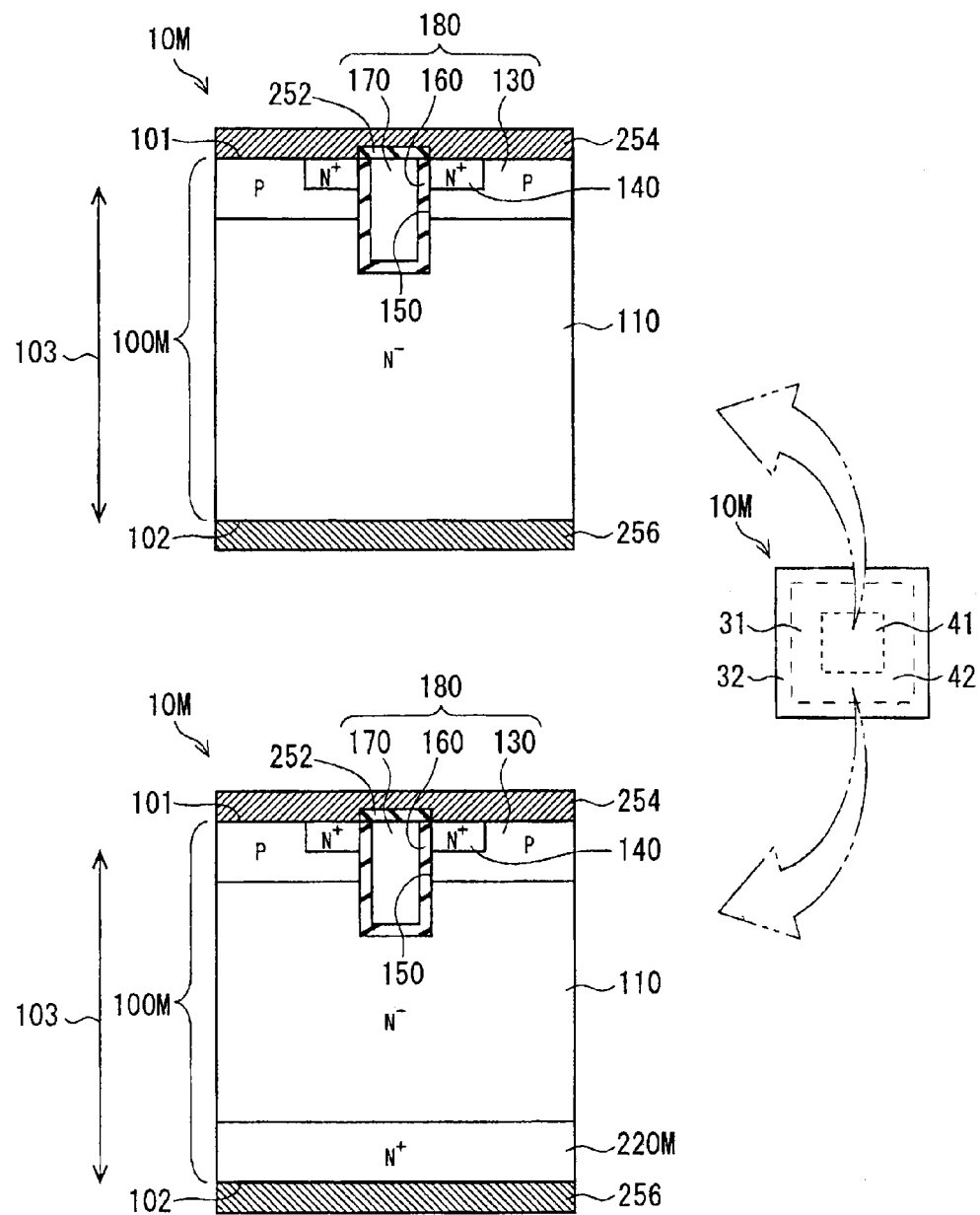
FIG. 29 schematically shows a power MISFET according to a twelfth preferred embodiment.

FIG. 29 schematically shows a power MOSFET 10M according to the twelfth preferred embodiment, which is similar to FIG. 5.

The MISFET 10M fundamentally has a similar configuration to that of the MISFET 10L (see FIG. 26) except for that the MISFET 10M includes a semiconductor substrate 100M in place of the semiconductor substrate 100L (see FIG. 26). The semiconductor substrate 100M fundamentally has a similar configuration to that of the semiconductor substrate 100L except for that the semiconductor substrate 100M includes a drain layer 220M in place of the drain layer 220L (see FIG. 26).

Figure 30:
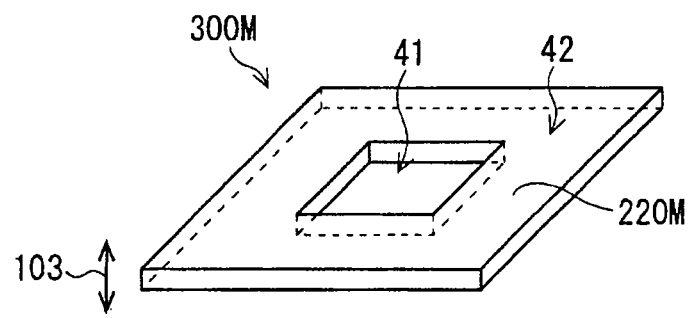
FIG. 30 is a perspective view schematically showing a drain layer according to the twelfth preferred embodiment.

FIG. 30 is a perspective view schematically showing the drain layer 220M. FIG. 30 shows the drain layer 220M enlarged from the substrate 100M. As can be seen from FIG. 29 and FIG. 30, the drain layer 220M has such a form as to be located in the peripheral portion 42 but not located in the central portion 41. It is assumed here that the impurity concentration is uniform in the drain layer 220M. The other conditions of the drain layer 220M are fundamentally similar to those of the drain layer 220L (see FIG. 26).

In the central portion 41 in which the drain layer 220M is not located, the drift layer 110 extends up to the second main surface 102 of the substrate 100M to be in contact with the drain electrode 256 (see upper-left part of FIG. 29).

In the drain layer 220M having the above-mentioned shape, the resistance to the current flowing in the substrate thickness direction 103 becomes higher in the central portion 41 than the peripheral portion 42. That is, the drain layer 220M forms a resistance control structure 300M (see FIG. 30) for making the resistance to the current flowing in the substrate thickness direction 103 higher in the central portion 41 than the peripheral portion 42.

A similar effect to that of the resistance control structure 300A (see FIG. 3) can be obtained also by the above-mentioned resistance control structure 300M.

It is also possible to manufacture the MISFET 10M by various known treatments. For example, it is possible to form the drain layer 220M by selectively subjecting only the peripheral portion 42 to ion implantation. Alternatively, the drain layer 220M may be formed by other techniques.

Note that, for example, it is also possible to configure the resistance control structure by combination of the drain layer 220M and the above-mentioned base layer 130J (see FIG. 22).

(Modifications of First to Twelfth Preferred Embodiments)

The cases where the switching element 180 is a so-called trench gate type have been described as examples. Contrary to this, it is also possible to modify the switching element 180 into a structure in which the gate insulating film 160 and the gate electrode 170 are laminated on the first main surface 101 without using the trench 150, into a so-called planar gate type switching element. The above-mentioned various effects can be obtained also by adopting the planar gate type switching element.

(Thirteenth Preferred Embodiment)

The IGBT and power MISFET have been described as examples of a power semiconductor device. In a thirteenth preferred embodiment, a power diode (hereinafter, abbreviated as "diode" as well) will be described as other example of the power semiconductor device.

Figure 31:
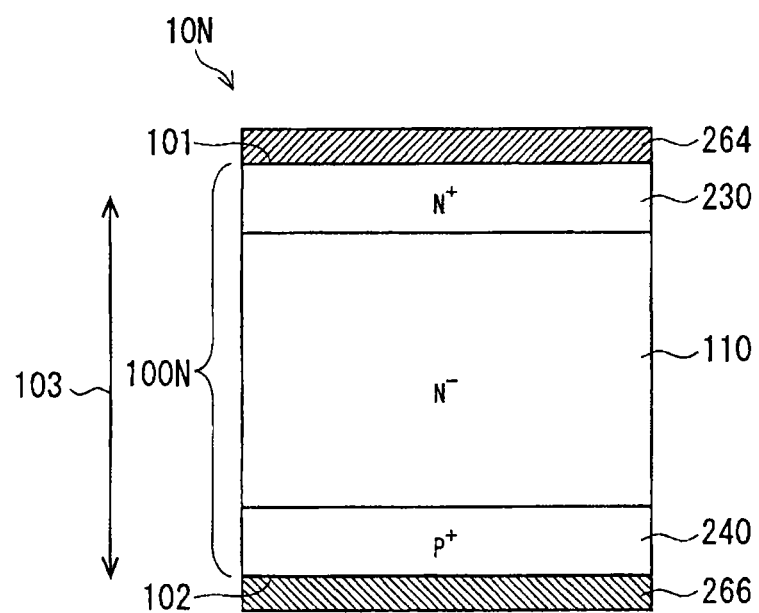
FIG. 31 is a vertical cross-sectional view schematically showing a power diode according to a thirteenth preferred embodiment.

FIG. 31 is a vertical cross-sectional view schematically showing a diode 10N according to the thirteenth preferred embodiment. With reference to FIG. 31, the diode 10N includes a semiconductor substrate 100N, a cathode electrode 264 and an anode electrode 266. Further, formed in the semiconductor substrate 100N are the drift layer 110 (corresponding to the "first semiconductor layer"), a cathode layer 230 (corresponding to the "third semiconductor layer") and an anode layer 240 (corresponding to the "second semiconductor layer"). Note that the drift layer 110 is provided as in the first preferred embodiment (see FIG. 2), and thus overlapping description is omitted here.

The cathode layer 230 is positioned between the drift layer 110 and the first main surface 101 of the substrate 100N and extends with the substrate direction 103 as the thickness direction thereof. In other words, the cathode layer 230 is positioned on the first main surface 101 side with respect to the drift layer 110 in the substrate thickness direction 103 and faces the drift layer 110 in the thickness direction 103. The cathode layer 230 is continuous from the drift layer 110 and reaches the first main surface 101. The case where the conductivity type of the cathode layer 230 is an N type, more specifically, the case where the cathode layer 230 has an impurity concentration higher than that of the drift layer 110 and is an $N^+$ type layer is described here as an example.

The anode layer 240 is positioned between the drift layer 110 and the second main surface 102 of the substrate 100N and extends with the substrate thickness direction 103 as the thickness direction thereof. In other words, the anode layer 240 is positioned on the second main surface 102 side with respect to the drift layer 110 in the substrate thickness direction 103 and faces the drift layer 110 in the thickness direction 103. The anode layer 240 is continuous from the drift layer 110 and reaches the second main surface 102. The case where the conductivity type of the anode layer 240 is a P type, more specifically, the case where the anode layer 240 is a $P^+$ type layer is described here as an example.

The cathode electrode 264 is disposed on the first main surface 101 of the substrate 100N and is in contact with the cathode layer 230. Further, the anode electrode 266 is disposed on the second main surface 102 of the substrate 100N and is in contact with the anode layer 240.

In the above-mentioned diode 10N, it is possible to form a resistance control structure with the anode layer 240 by adopting the impurity concentration distribution of the above-mentioned collector layer 200A (see FIG. 2 to FIG. 4) or the shape of the above-mentioned collector layer 200B (see FIG. 5 and FIG. 6) in the anode layer 240.

Alternatively, it is possible to form a resistance control structure by providing the above-mentioned lifetime control layer 210C (see FIG. 7 to FIG. 9) or the above-mentioned lifetime control layer 210D (see FIG. 10 and FIG. 11) to the drift layer 110.

Still alternatively, it is possible to form a resistance control structure by adding the above-mentioned buffer layer 190E (see FIG. 12 to FIG. 14) or the above-mentioned buffer layer 190F (see FIG. 15 and FIG. 16) between the drift layer 110 and the anode layer 240.

Yet still alternatively, the impurity concentration distribution of the above-mentioned carrier stored layer 120G (see FIG. 17 to FIG. 19) or the shape of the above-mentioned carrier stored layer 120H (see FIG. 20 and FIG. 21) may be adopted in the cathode layer 230. In such an example, it is possible to form a resistance control structure by the cathode layer 230.

Note that various components may be combined to form a resistance control structure in the power diode 10N.

It is also possible to manufacture the power diode 10N by various treatments. In this case, for example, the method of forming the above-mentioned collector layer 200A or the like can be employed.

(Modifications of First to Thirteenth Preferred Embodiments)

Note that the respective preferred embodiments described above can be appropriately combined unless they are inconsistent with each other.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising a semiconductor substrate in which current flows in a thickness direction of said semiconductor substrate,
   wherein said semiconductor substrate includes:
   a first semiconductor layer of a first conductivity type which extends laterally to run across a central portion of said semiconductor substrate and a peripheral portion of said semiconductor substrate laterally surrounding said central portion; and
   a second semiconductor layer of a second conductivity type which faces said first semiconductor layer in said thickness direction;
   said second semiconductor layer has a form to be located in said peripheral portion but not located in said central portion; and
   said second semiconductor layer provides a resistance control structure having a resistance to current higher in said central portion than said peripheral portion.

2. The power semiconductor device according to claim 1, wherein said resistance control structure comprises a void in said second semiconductor layer.

3. The power semiconductor device according to claim 2, wherein said first semiconductor layer extends into said void.

4. The power semiconductor device according to claim 1, comprising:
- an electrode;
- said second semiconductor layer directly formed on said electrode;
- said resistance control structure comprising a void in said second semiconductor layer; and
- said first semiconductor layer extending through the void to contact said electrode.

5. The power semiconductor device according to claim 4, wherein said second semiconductor layer comprises a collector layer.

6. The power semiconductor device according to claim 5, wherein said first semiconductor layer comprises a buffer layer.

7. The power semiconductor device according to claim 1, wherein said second semiconductor layer comprises a collector layer.

\* \* \* \* \*